United States Patent
Okamoto

(10) Patent No.: US 12,160,079 B2
(45) Date of Patent: Dec. 3, 2024

(54) SEMICONDUCTOR LASER ELEMENT, SEMICONDUCTOR LASER ARRAY AND PROCESSING APPARATUS

(71) Applicant: Panasonic Holdings Corporation, Osaka (JP)

(72) Inventor: Takatoshi Okamoto, Osaka (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 421 days.

(21) Appl. No.: 17/804,638

(22) Filed: May 31, 2022

(65) Prior Publication Data

US 2022/0407282 A1    Dec. 22, 2022

(30) Foreign Application Priority Data

Jun. 18, 2021    (JP) ................. 2021-101848

(51) Int. Cl.
| | |
|---|---|
| H01S 5/14 | (2006.01) |
| H01S 3/08 | (2023.01) |
| H01S 5/10 | (2021.01) |
| H01S 5/40 | (2006.01) |

(52) U.S. Cl.
CPC ........ *H01S 3/08059* (2013.01); *H01S 5/1039* (2013.01); *H01S 5/14* (2013.01); *H01S 5/141* (2013.01); *H01S 5/4062* (2013.01); *H01S 5/4087* (2013.01)

(58) Field of Classification Search
CPC .... H01S 5/4012; H01S 5/4087; H01S 5/4062; H01S 5/141; H01S 5/143
See application file for complete search history.

(56) References Cited

U.S. PATENT DOCUMENTS

| | | | | |
|---|---|---|---|---|
| 6,697,414 B1* | 2/2004 | Kato | ............... | G02B 6/4244 |
| | | | | 372/102 |
| 7,248,618 B2* | 7/2007 | Volodin | ............. | G02B 27/0944 |
| | | | | 372/102 |
| 9,577,409 B1* | 2/2017 | Connolly | ............. | H01S 5/1039 |

(Continued)

FOREIGN PATENT DOCUMENTS

| | | |
|---|---|---|
| JP | 2007-109737 A | 4/2007 |
| JP | 2013-152275 A | 8/2013 |

(Continued)

*Primary Examiner* — Tod T Van Roy
*Assistant Examiner* — Fernanda Adriana Camacho Alanis
(74) *Attorney, Agent, or Firm* — Pearne & Gordon LLP

(57) ABSTRACT

Provided is a semiconductor laser element including: a resonator structure; and a first reflection film and a second reflection film provided on a non-emission end surface of the resonator structure and an emission end surface of the resonator structure, respectively. Reflectance R of the second reflection film at a gain wavelength satisfies the following relational expression: $R1 \leq R \leq R(Oc) \times C$ where $R1$ is reflectance of the second reflection film when the resonator structure performs laser oscillation with power 1.4 times a minimum value of threshold power which is minimum power for the resonator structure to perform the laser oscillation, $R(Oc)$ is reflectance of the external resonance mirror, and C is a ratio of light, which is reflected by the external resonance mirror and is incident in the resonator structure, to light which is reflected by the external resonance mirror.

8 Claims, 15 Drawing Sheets

(56) References Cited

U.S. PATENT DOCUMENTS

2008/0181275 A1    7/2008  Matsuyama et al.
2014/0240831 A1*   8/2014  Chann ................ G02B 27/1006
                                                  359/489.08

FOREIGN PATENT DOCUMENTS

| JP | 2015-106707 A  | 6/2015 |
| JP | 2019-129219 A  | 8/2019 |
| JP | 2021-086960 A  | 6/2021 |
| WO | 2016-152730 A1 | 9/2016 |

* cited by examiner

SEMICONDUCTOR LASER ELEMENT, SEMICONDUCTOR LASER ARRAY AND PROCESSING APPARATUS

CROSS REFERENCE TO RELATED APPLICATIONS

This application is entitled to and claims the benefit of Japanese Patent Application No. 2021-101848 filed on Jun. 18, 2021, the disclosure of which including the specification, drawings and abstract is incorporated herein by reference in its entirety.

TECHNICAL FIELD

The present disclosure relates to a semiconductor laser element, a semiconductor laser array and a processing apparatus.

BACKGROUND ART

In recent years, there are growing expectations for laser processing on various kinds of materials such as copper, gold and resin. For example, in the automotive industry, electrification, miniaturization, high rigidity, enhanced design flexibility, enhanced productivity, and the like have been required and there are high expectations for laser processing.

In particular, in a case where metal such as copper is processed using laser light in the production of motors and batteries for electric vehicles, it is necessary to use a laser light source capable of outputting laser light ranging from blue-violet laser light to blue laser light (with a wavelength of equal to or larger than 350 nm and equal to or smaller than 450 nm) with a high optical absorption efficiency. Further, a laser light source having high output and beam quality with high light-collecting property is required for realizing highly productive laser processing.

For this reason, there is a demand for developing a laser processing apparatus that outputs laser light with high output and high beam quality by collecting a plurality of laser lights. For example, Patent Literature (hereinafter referred to as "PTL") 1 discloses a Wavelength Beam Combining (WBC) system that collects laser lights outputted from a plurality of beam emitters arranged one-dimensionally. In a WBC type laser processing apparatus, a monolithic type semiconductor laser array is used, for example.

The monolithic type semiconductor laser array includes a plurality of emitters configured for outputting laser light. For this reason, the light output value of a WBC type processing apparatus corresponds to the sum of the output values of laser lights outputted from a plurality of emitters.

CITATION LIST

Patent Literature

PTL 1
Japanese Patent Application Laid-Open No. 2015-106707

SUMMARY OF INVENTION

Technical Problem

A semiconductor laser array included in a conventional WBC type processing apparatus is provided with a reflection film on an emission end surface of the semiconductor laser array. A sufficient output value may not be obtained from the processing apparatus depending on the value of reflectance of the reflection film at a gain wavelength of the semiconductor laser array (hereinafter the "reflectance at a gain wavelength" may also be referred to simply as "reflectance").

An object of the present disclosure is to provide a semiconductor laser element, a semiconductor laser array and a processing apparatus each capable of achieving high output of a laser processing apparatus.

Solution to Problem

A semiconductor laser element of the present disclosure is a semiconductor laser element disposed in a wavelength beam combining type processing apparatus including an external resonance mirror and includes:
  a resonator structure including a light-emitting layer that emits laser light; and
  a first reflection film and a second reflection film that are provided on a non-emission end surface of the resonator structure and an emission end surface of the resonator structure, respectively, and reflect the laser light, wherein
  reflectance R of the second reflection film at a gain wavelength of the semiconductor laser element satisfies the following relational expression:

$$R1 \leq R \leq R(Oc) \times C$$

where $R1$ is reflectance of the second reflection film when the resonator structure performs laser oscillation with power 1.4 times a minimum value of threshold power, $R(Oc)$ is reflectance of the external resonance mirror, and $C$ is coupling efficiency, where the threshold power is minimum power for the resonator structure to perform the laser oscillation, and the coupling efficiency is a ratio of light, which is reflected by the external resonance mirror and is incident in the resonator structure, to light which is reflected by the external resonance mirror.

A semiconductor laser element of the present disclosure is a semiconductor laser element disposed in a wavelength beam combining type processing apparatus including an external resonance mirror and includes:
  a resonator structure including a light-emitting layer that emits laser light; and
  a first reflection film and a second reflection film that are provided on a non-emission end surface of the resonator structure and an emission end surface of the resonator structure, respectively, and reflect the laser light, wherein reflectance R of the second reflection film at a gain wavelength of the semiconductor laser element satisfies the following relational expression:

$$R1 \leq R \leq 2 \times R(Oc) \times C$$

where $R1$ is reflectance of the second reflection film when the resonator structure performs laser oscillation with power 1.4 times a minimum value of threshold power, $R(Oc)$ is reflectance of the external resonance mirror, and $C$ is coupling efficiency, where the threshold power is minimum power for the resonator structure to perform the laser oscillation, and the coupling efficiency is a ratio of light, which is reflected by the external resonance mirror and is incident in the resonator structure, to light which is reflected by the external resonance mirror.

A semiconductor laser element of the present disclosure is a semiconductor laser element disposed in a wavelength beam combining type processing apparatus including an external resonance mirror and includes:
   a resonator structure including a light-emitting layer that emits laser light; and
   a first reflection film and a second reflection film that are provided on a non-emission end surface of the resonator structure and an emission end surface of the resonator structure, respectively, and reflect the laser light, wherein
   reflectance R of the second reflection film at a gain wavelength of the semiconductor laser element satisfies the following relational expression:

$$R1 \leq R \leq 3 \times R(Oc) \times C$$

where R1 is reflectance of the second reflection film when the resonator structure performs laser oscillation with power 1.4 times a minimum value of threshold power, R(Oc) is reflectance of the external resonance mirror, and C is coupling efficiency, where the threshold power is minimum power for the resonator structure to perform the laser oscillation, and the coupling efficiency is a ratio of light, which is reflected by the external resonance mirror and is incident in the resonator structure, to light which is reflected by the external resonance mirror.

A semiconductor laser array of the present disclosure includes a plurality of the semiconductor laser elements having one of the configurations described above.

A wavelength beam combining type processing apparatus of the present disclosure includes one of the semiconductor laser elements described above.

A wavelength beam combining type processing apparatus of the present disclosure includes the semiconductor laser array described above.

Advantageous Effects of Invention

According to the present disclosure, it is possible to provide a semiconductor laser element, a semiconductor laser array and a processing apparatus each capable of achieving high output of a laser processing apparatus.

DESCRIPTION OF EMBODIMENTS

Figure 2:
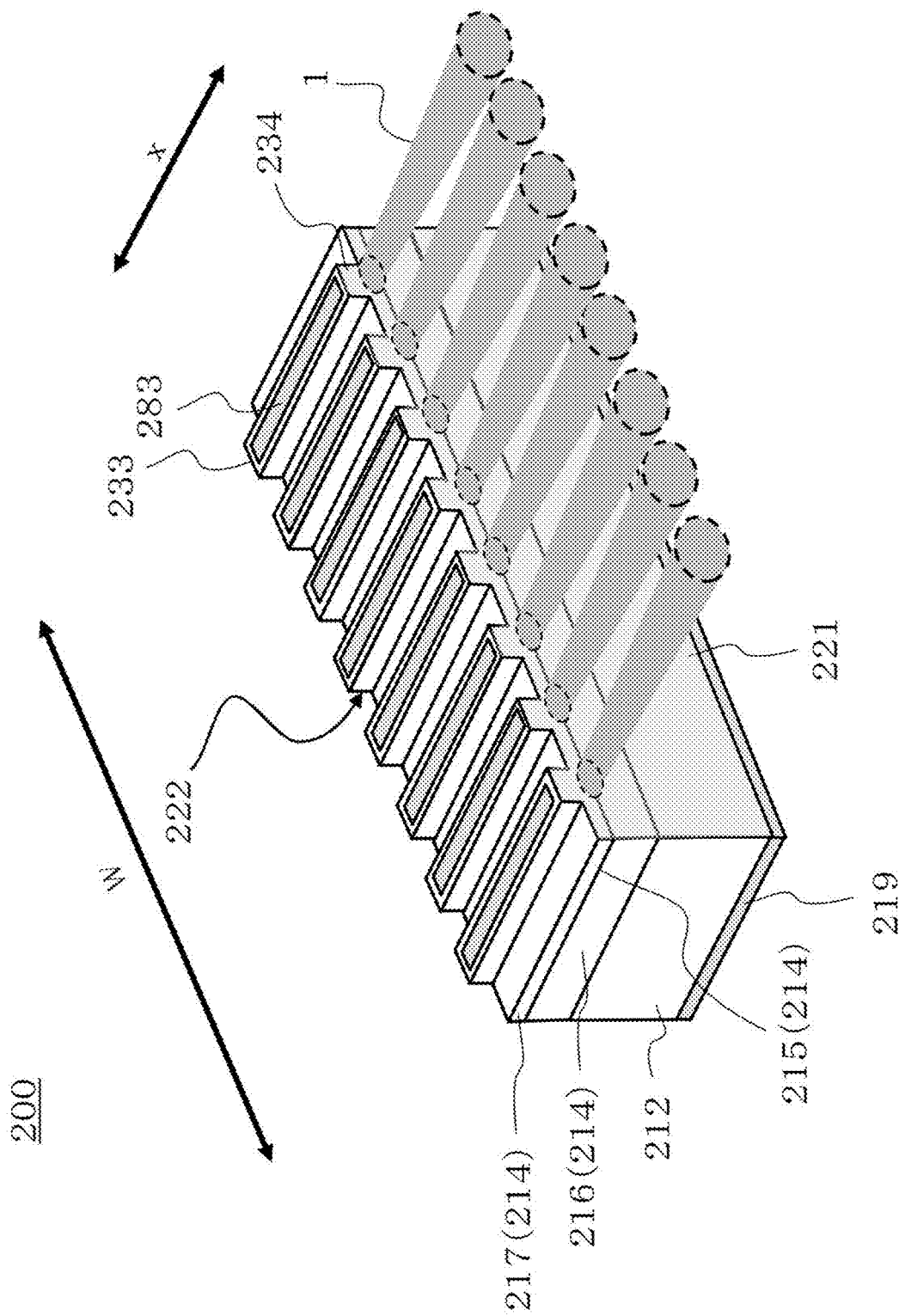
FIG. 2 illustrates a semiconductor laser array according to the embodiment.
Figure 3:
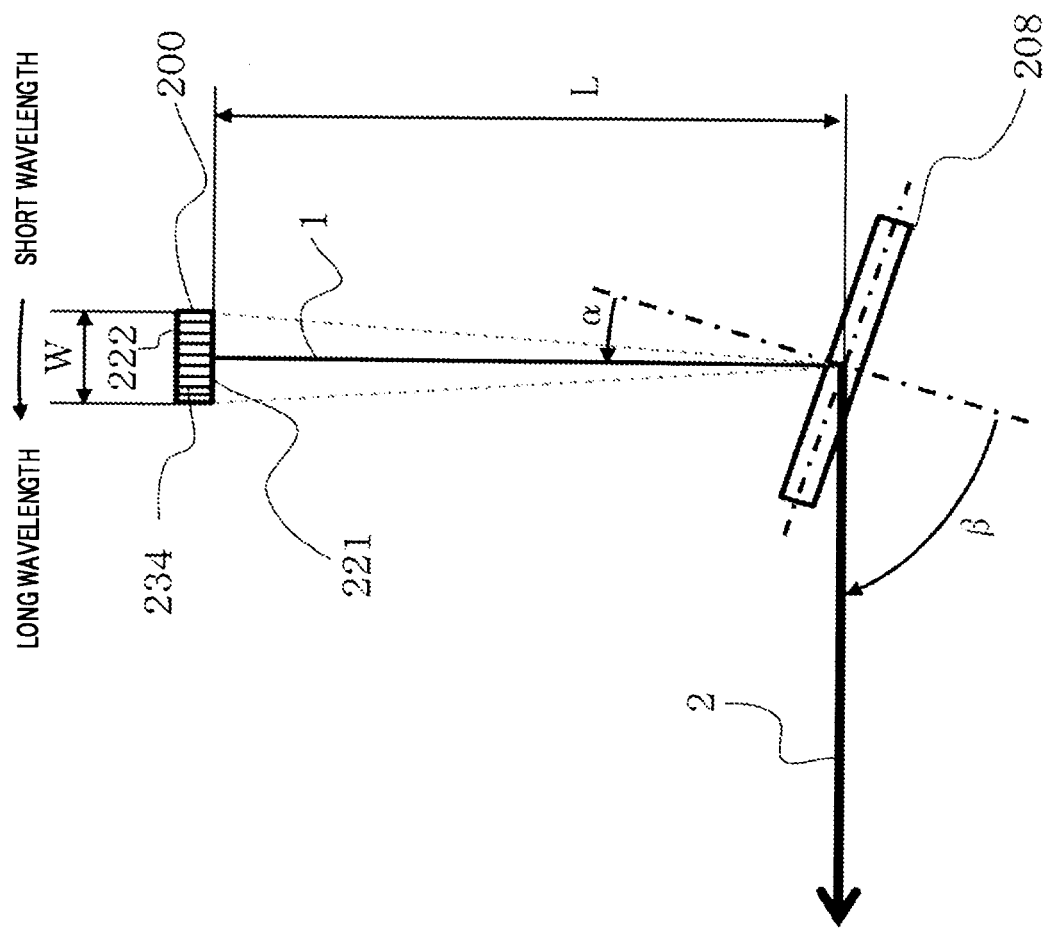
FIG. 3 illustrates a relationship between the semiconductor laser array and a diffraction grating according to the embodiment.

First, the background to the semiconductor laser element, the semiconductor laser array and the processing apparatus according to the present disclosure will be described with reference to FIGS. 1 to 3.

Figure 1:
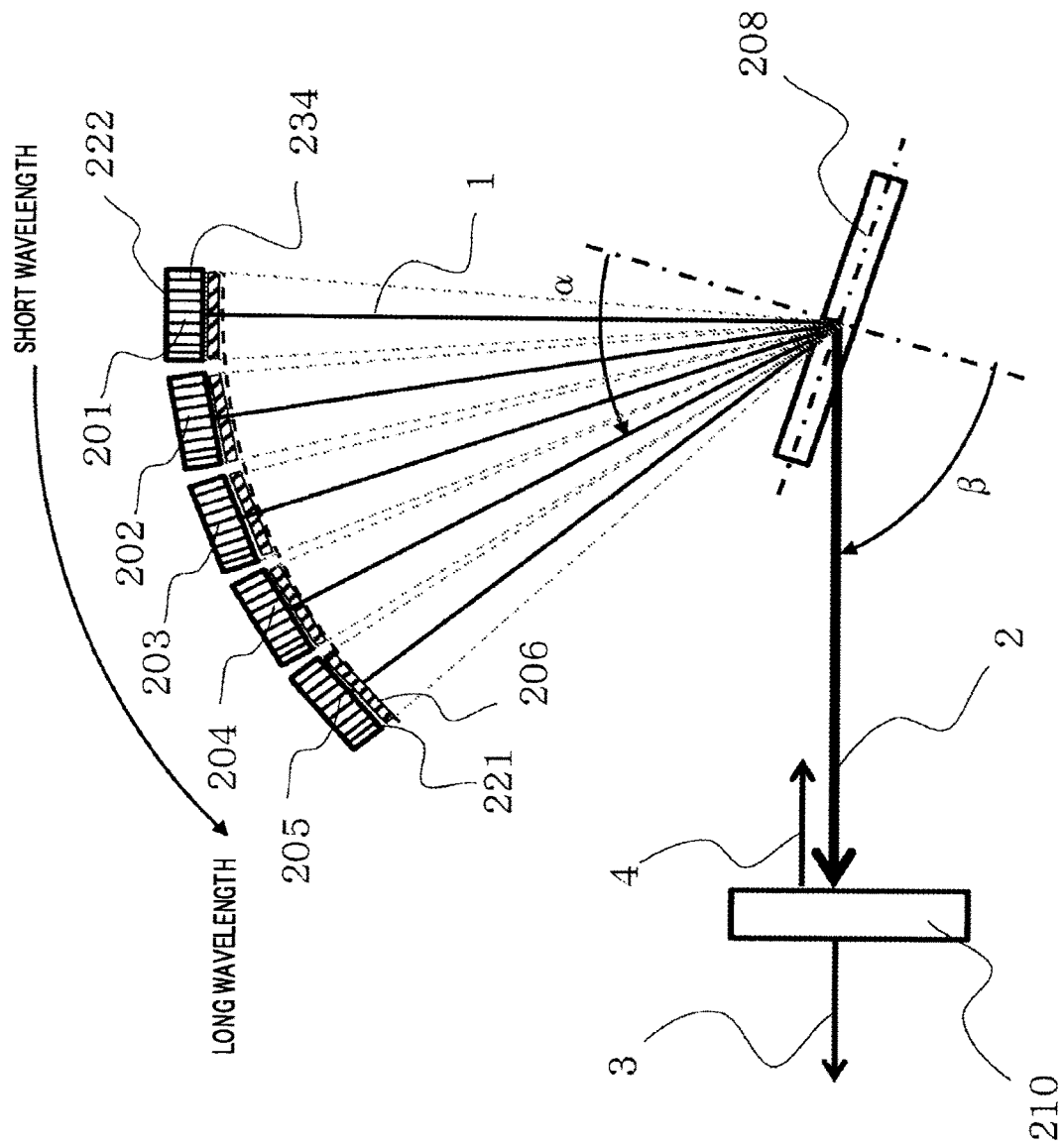
FIG. 1 illustrates a conceptual diagram of a high-output laser oscillator used in a WBC type processing apparatus according to an embodiment.

FIG. 1 illustrates a conceptual diagram of high-output laser oscillator (hereinafter referred to simply as "laser oscillator") 10 used in a WBC type processing apparatus according to the present embodiment. FIG. 2 illustrates semiconductor laser array 200 according to the present embodiment. FIG. 3 illustrates a relationship between semiconductor laser array 200 and diffraction grating 208 according to the present embodiment.

Laser oscillator 10 includes a plurality of semiconductor laser arrays 201 to 205, a plurality of beam twister units 206, diffraction grating 208, and external resonance mirror 210. Note that, in the following description, the plurality of semiconductor laser arrays 201 to 205 provided in laser oscillator 10 will be described as semiconductor laser array 200 in a case where no distinction is made among semiconductor laser arrays 201 to 205.

Semiconductor laser array 200 includes resonator structure 214. Resonator structure 214 is an operation layer in which first semiconductor layer 216, light-emitting layer 215, and second semiconductor layer 217 are laminated. Further, semiconductor laser array 200 has a ridge stripe structure, and a plurality of emitters 234 configured to emit laser light 1 is formed in a stripe shape in resonator structure 214. In resonator structure 214, the parts immediately below projections 233 form individual emitters 234.

In resonator structure 214, laser light 1 is emitted from one end surface of emitter 234. Hereinafter, an end surface of semiconductor laser array 200, from which laser light 1 is emitted, will be referred to as "emission end surface", and an end surface of semiconductor laser array 200, which is located on the opposite side of the emission end surface and from which laser light 1 is not emitted, will be referred to as "non-emission end surface".

The emission end surface of semiconductor laser array 200 is provided with reflection film 221, and the non-emission end surface of semiconductor laser array 200 is provided with reflection film 222.

The plurality of beam twister units 206 is disposed on sides of the emission end surfaces of semiconductor laser arrays 201 to 205, respectively. Beam twister units 206 rotate a plurality of laser lights 1 emitted from semiconductor laser arrays 201 to 205 by 90°, respectively, which prevents the plurality of laser lights 1 having wavelengths close to each other from interfering with each other. Laser light 1 rotated by beam twister unit 206 is incident on diffraction grating 208.

Diffraction grating 208 is a transmission type or reflection type diffraction grating. FIG. 1 indicates that diffraction grating 208 is a transmission type diffraction grating. In a case where diffraction grating 208 is a transmission type diffraction grating as described above, diffraction grating 208 diffracts laser light 1, which is incident, at output angle (diffraction angle) β in accordance with the wavelength of laser light 1, and emits laser light 1, which has been diffracted, as external resonance light 2. External resonance light 2 emitted from diffraction grating 208 is incident on external resonance mirror 210.

External resonance mirror 210 is a partial transmission type mirror. Light 4 that is a part of external resonance light 2 is perpendicularly reflected toward diffraction grating 208 by external resonance mirror 210. Thus, laser light having a predetermined lock wavelength causes external resonance between reflection film 222 on the non-emission end surface and external resonance mirror 210 and is outputted as laser light 3 from external resonance mirror 210. Here, the lock wavelength is uniquely determined by a positional relationship among emitter 234, diffraction grating 208 and external resonance mirror 210.

(Lock Wavelength)

Lock wavelengths of semiconductor laser arrays 201 to 205 will be described.

Of laser lights 1 emitted from emitters 234 of semiconductor laser arrays 201 to 205, only light 4 that satisfies a diffraction condition for diffraction grating 208 and is perpendicularly reflected by external resonance mirror 210 returns to emitter 234 from which light 4 is emitted, and external resonance is performed by reflection film 222 on the non-emission end surface and external resonance mirror 210. Then, laser oscillation due to the external resonance is generated.

In semiconductor laser array 200, when the lock wavelength of each emitter 234 corresponding to an injection region of a current is $\lambda_L$, the period of diffraction grating 208 is d, the incident angle of laser light 1 on diffraction grating 208 is α, the output angle of external resonance light 2 is β, and the degree is m (integer), lock wavelength $\lambda_L$ is calculated based on relational expression 0.

$$d(\sin \alpha + \sin \beta) = m\lambda_L \quad \text{(Relational Expression 0)}$$

Note that, degree m may take a different value depending on a position at which diffraction grating 208 is disposed. For example, the calculation becomes easier when diffraction grating 208 is disposed such that m=1.

For example, it is assumed as illustrated in FIG. 1 that five semiconductor laser arrays 201 to 205 are disposed in laser oscillator 10 such that incident angles α of laser lights 1 on diffraction grating 208 are 21.6 deg, 22.4 deg, 23.2 deg, 24.0 deg, and 24.8 deg, respectively.

In this case, as illustrated in Table 1, lock wavelengths $\lambda_{L\_CENTER}$ of emitters 234 located in the centers of semiconductor laser arrays 201 to 205 will be 435.9 nm, 440.3 nm, 444.5 nm, 448.8 nm, and 453.0 nm, respectively. That is, lock wavelengths $\lambda_{L\_CENTER}$ of semiconductor laser arrays 201 to 205 change by approximately 4.3 nm.

TABLE 1

| | Configuration of High-Output Laser Oscillator used in Wavelength Beam Combining Type Processing Apparatus | | | | | | Calculated Value | | |
|---|---|---|---|---|---|---|---|---|---|
| Item Unit | Laser Array Reference Sign | Diffraction Grating Groove Period Lines/mm | Diffraction Grating Period d μm | Output Angle β deg | Incident Angle α deg | Degree m | sin β | sin α | Laser Array Center Emitter Lock Wavelength $\lambda_{L\_CENTER}$ nm |
| | 201 | 3000 | 0.333 | 70 | 21.6 | 1 | 0.940 | 0.368 | 435.9 |
| | 202 | 3000 | 0.333 | 70 | 22.4 | 1 | 0.940 | 0.381 | 440.3 |
| | 203 | 3000 | 0.333 | 70 | 23.2 | 1 | 0.940 | 0.394 | 444.5 |
| | 204 | 3000 | 0.333 | 70 | 24.0 | 1 | 0.940 | 0.407 | 448.8 |
| | 205 | 3000 | 0.333 | 70 | 24.8 | 1 | 0.940 | 0.419 | 453.0 |

Next, with respect to lock wavelength XL of semiconductor laser array 200, a case where following element conditions (A) and (B) and disposition conditions (C) to (E) are satisfied will be described as an example.

<Element Conditions>

(A) Semiconductor laser array 200 includes 25 emitters 234; and (B) Length (hereinafter referred to as "array width") W in a direction in which emitters 234 are arranged in semiconductor laser array 200 is 10 mm.

<Disposition Conditions>

(C) Laser light 1 emitted from semiconductor laser array 200 has a wavelength of approximately equal to or larger than 400 nm and equal to or smaller than 500 nm, and incident angle α of laser light 1 on diffraction grating 208 is 21.1°;

(D) Distance L between semiconductor laser array 200 and diffraction grating 208 is 2.6 m; and (E) Diffraction grating 208 has a groove period of 3000 lines/mm, that is, period d of diffraction grating 208 is 0.333 μm.

In a case where element conditions (A) and (B) and disposition conditions (C) to (E) described above are satisfied, lock wavelengths $\lambda_L$ in emitters 234 of semiconductor laser array 200 are as illustrated in Table 2.

TABLE 2

Configuration of High-Output Laser Oscillator used in
Wavelength Beam Combining Type Processing Apparatus

| Item Unit | Emitter Number | Diffraction Grating Groove Period Lines/mm | Diffraction Grating Period d μm | Output Angle β deg | Distance L between Diffraction Grating and Semiconductor Laser Array m | Bar Length mm | Interval mm | Position from Center mm | Incident Angle α deg | Degree m | Calculated Value ||| Lock Wavelength $\lambda_L$ of Emitter nm |
|---|---|---|---|---|---|---|---|---|---|---|---|---|---|
| | | | | | | | | | | | sin β | sin α | |
| End | 1 | 3000 | 0.333 | 70 | 2.6 | 10 | 0.5 | 4.8 | 21.49 | 1 | 0.940 | 0.366 | 435.37 |
| | 2 | 3000 | 0.333 | 70 | 2.6 | 10 | 0.5 | 4.4 | 21.50 | 1 | 0.940 | 0.367 | 435.41 |
| | 3 | 3000 | 0.333 | 70 | 2.6 | 10 | 0.5 | 4.0 | 21.51 | 1 | 0.940 | 0.367 | 435.46 |
| | 4 | 3000 | 0.333 | 70 | 2.6 | 10 | 0.5 | 3.6 | 21.52 | 1 | 0.940 | 0.367 | 435.51 |
| | 5 | 3000 | 0.333 | 70 | 2.6 | 10 | 0.5 | 3.2 | 21.53 | 1 | 0.940 | 0.367 | 435.56 |
| | 6 | 3000 | 0.333 | 70 | 2.6 | 10 | 0.5 | 2.8 | 21.54 | 1 | 0.940 | 0.367 | 435.61 |
| | 7 | 3000 | 0.333 | 70 | 2.6 | 10 | 0.5 | 2.4 | 21.55 | 1 | 0.940 | 0.367 | 435.65 |
| | 8 | 3000 | 0.333 | 70 | 2.6 | 10 | 0.5 | 2.0 | 21.56 | 1 | 0.940 | 0.367 | 435.70 |
| | 9 | 3000 | 0.333 | 70 | 2.6 | 10 | 0.5 | 1.6 | 21.56 | 1 | 0.940 | 0.368 | 435.75 |
| | 10 | 3000 | 0.333 | 70 | 2.6 | 10 | 0.5 | 1.2 | 21.57 | 1 | 0.940 | 0.368 | 435.80 |
| | 11 | 3000 | 0.333 | 70 | 2.6 | 10 | 0.5 | 0.8 | 21.58 | 1 | 0.940 | 0.368 | 435.84 |
| | 12 | 3000 | 0.333 | 70 | 2.6 | 10 | 0.5 | 0.4 | 21.59 | 1 | 0.940 | 0.368 | 435.89 |
| Center | 13 | 3000 | 0.333 | 70 | 2.6 | 10 | 0.5 | 0.0 | 21.60 | 1 | 0.940 | 0.368 | $\lambda_{L\_CENTER}$ = 435.94 |
| | 14 | 3000 | 0.333 | 70 | 2.6 | 10 | 0.5 | -0.4 | 21.61 | 1 | 0.940 | 0.368 | 435.99 |
| | 15 | 3000 | 0.333 | 70 | 2.6 | 10 | 0.5 | -0.8 | 21.62 | 1 | 0.940 | 0.368 | 436.03 |
| | 16 | 3000 | 0.333 | 70 | 2.6 | 10 | 0.5 | -1.2 | 21.63 | 1 | 0.940 | 0.369 | 436.08 |
| | 17 | 3000 | 0.333 | 70 | 2.6 | 10 | 0.5 | -1.6 | 21.64 | 1 | 0.940 | 0.369 | 436.13 |
| | 18 | 3000 | 0.333 | 70 | 2.6 | 10 | 0.5 | -2.0 | 21.64 | 1 | 0.940 | 0.369 | 436.18 |
| | 19 | 3000 | 0.333 | 70 | 2.6 | 10 | 0.5 | -2.4 | 21.65 | 1 | 0.940 | 0.369 | 436.23 |
| | 20 | 3000 | 0.333 | 70 | 2.6 | 10 | 0.5 | -2.8 | 21.66 | 1 | 0.940 | 0.369 | 436.27 |
| | 21 | 3000 | 0.333 | 70 | 2.6 | 10 | 0.5 | -3.2 | 21.67 | 1 | 0.940 | 0.369 | 436.32 |
| | 22 | 3000 | 0.333 | 70 | 2.6 | 10 | 0.5 | -3.6 | 21.68 | 1 | 0.940 | 0.369 | 436.37 |
| | 23 | 3000 | 0.333 | 70 | 2.6 | 10 | 0.5 | -4.0 | 21.69 | 1 | 0.940 | 0.370 | 436.42 |
| | 24 | 3000 | 0.333 | 70 | 2.6 | 10 | 0.5 | -4.4 | 21.70 | 1 | 0.940 | 0.370 | 436.46 |
| End | 25 | 3000 | 0.333 | 70 | 2.6 | 10 | 0.5 | -4.8 | 21.71 | 1 | 0.940 | 0.370 | 436.51 |
| | | | | | | | | | | | | | $\Delta\lambda Z_{L\_BAR}$ = 1.1 nm |

The numbers of emitters 234 in Table 2 refer to numbers assigned to 25 emitters 234, respectively. Specifically, in FIG. 3, the numbers of 1 to 25 are assigned in this order to the emitter located on a side of one end (a side of the right end) through the emitter located on a side of the other end (a side of the left end) among the plurality of emitters 234.

As illustrated in Table 2, lock wavelength $\lambda_L$ of emitter 234 that is the first from the side of the one end (the side of the right end) is 435.7 nm, and lock wavelength $\lambda_L$ of emitter 234 that is the 25th emitter from the side of the one end is 436.51 nm. Lock wavelength becomes longer by approximately 0.05 nm from the side of the one end to the side of the other end (the side of the left end). Difference $\lambda_{L\_BAR}$ between lock wavelengths $\lambda_L$ of emitters 234 at the both ends of semiconductor laser array 200 is approximately 1.1 nm.

Each of individual emitters 234 of semiconductor laser arrays 201 to 205 has a different relative position with respect to diffraction grating 208. For this reason, external resonance is generated at different wavelengths in emitters 234 and laser light 1 oscillates. However, laser lights 1 from numerous emitters 234 are collected at diffraction grating 208 and are collected as external resonance light 2 at one point on an incidence surface of external resonance mirror 210. Note that, the output value of laser light 3 (the output value of laser oscillator 10) becomes higher as coincidence of the lock wavelengths and the gain wavelengths of semiconductor laser arrays 201 to 205 is higher. Further, the output value of the processing apparatus including laser oscillator 10 becomes higher.

Since laser oscillator 10 collects laser lights 1 emitted from individual emitters 234, laser light 3 becomes high-power laser light. The output value of laser light 3 corresponds to the sum of the output values of laser lights 1 emitted from individual emitters 234.

Hereinafter, reflectance of reflection film 221 on the emission end surface of semiconductor laser array 200 will be described.

(Case where Reflectance of Reflection Film 221 is High)

When the reflectance of each reflection film 221 on the emission end surfaces of semiconductor laser arrays 201 to 205 is caused to be larger than 0%, internal resonance occurs in theory between each reflection film 221 on the emission end surfaces and each reflection film 222 on the non-emission end surfaces.

In a case where the effect of the internal resonance described above is large with respect to the effect of external resonance between reflection film 222 on the non-emission end surface and external resonance mirror 210 when laser light 3 oscillates, the internal resonance may hinder laser oscillation by the external resonance and the output value of laser light 3 may decrease.

For this reason, it has been considered that the effect of internal resonance is desirably reduced, and that the reflectance of reflection film 221 on the emission end surface is desirably 0%, that is, 100% of laser light 1 emitted from emitter 234 desirably pass through the emission end surface.

(Case where Reflectance of Reflection Film 221 is Low)

The present inventors have noticed that it is not necessarily more desirable as the reflectance of reflection film 221 on the emission end surface is lower.

The gain wavelength and various properties of semiconductor laser array 200 are measured prior to incorporation of semiconductor laser array 200 into laser oscillator 10.

In order to enhance the output value of laser light 3 when laser oscillator 10 is produced, it is necessary to enhance coincidence of the gain wavelength of semiconductor laser array 200 and the lock wavelength as much as possible.

The gain wavelength is determined by the properties of semiconductor laser array 200, and the lock wavelength is determined, as described above, by the positional relationship among semiconductor laser array 200 (in particular emitter 234), diffraction grating 208 and external resonance mirror 210.

For this reason, in order to cause the gain wavelength and the lock wavelength to coincide with each other, it is necessary to measure the gain wavelength of semiconductor laser array 200 in advance and to adjust the positional relationship among semiconductor laser array 200 (in particular emitter 234), diffraction grating 208 and external resonance mirror 210 in accordance with the measured result.

Further, the measurement of the various properties is executed for selecting a semiconductor laser array suitable for being incorporated into laser oscillator 10.

The gain wavelength and the various properties are measured based on laser light 1 outputted when internal resonance is generated in semiconductor laser array 200.

In a case where the reflectance of reflection film 221 on the emission end surface is set to, for example, 0.005% (corresponding to the measurement limit value of common reflectance measuring equipment), the amount of laser light 1 to be confined in an optical waveguide section of emitter 234 is extremely small and internal resonance is less likely to occur.

That is, the smaller the reflectance of reflection film 221 on the emission end surface, the larger the power (hereinafter referred to as "threshold power") required to cause semiconductor laser array 200 to perform laser oscillation by internal resonance.

While laser oscillation is not performed, the energy of power (current) supplied to semiconductor laser array 200 is not converted into light energy, but is converted into thermal energy. In a case where the thermal energy is large, a defect (for example, crystal defect) may be generated inside semiconductor laser array 200 and light-emitting layer 215 and/or emitter 234 may be broken.

In particular, in a case where a crystal defect is generated in a portion of emitter 234, where the portion corresponds to light-emitting layer 215, and the portion is broken, the output value of laser light 1 emitted from emitter 234 decreases. In addition, the output value of semiconductor laser array 200 and further the output value of laser oscillator 10 based on external resonance also decrease. In addition, the output value of the processing apparatus including laser oscillator 10 also decreases.

It is difficult to discover an abnormal portion such as a crystal defect and a broken portion in advance by measurement and/or analysis. Further, after the incorporation of semiconductor laser array 200 into laser oscillator 10, an abnormal region may grow starting from an abnormal portion inside semiconductor laser array 200 and the laser output value of laser oscillator 10 may further decrease. That is, the output value of laser oscillator 10 may become unstable. Further, the output value of the processing apparatus including laser oscillator 10 may decrease or may become unstable.

In summary, internal resonance generated in semiconductor laser array 200 when the processing apparatus including laser oscillator 10 is used for processing an object to be processed may result in a decrease in the output value of laser oscillator 10. On the other hand, in order to increase the output value of laser oscillator 10, it is necessary to generate laser oscillation by internal resonance and to measure the gain wavelength and the various properties before the incorporation of semiconductor laser array 200 into laser oscillator 10. Hereinafter, such measurement may also be referred to as "pre-measurement".

Note that, the above-described problem holds true not only for semiconductor laser array 200, but also for semiconductor laser element 100 including only one emitter 234 (see FIG. 7) in the same manner.

Then, the present inventors have found, as a result of conducting an earnest investigation into internal resonance in semiconductor laser array 200, that following (Effect 1) and (Effect 2) can be obtained by adjusting the reflectance of reflection film 221 on a side of the emission end surface of semiconductor laser array 200 to an appropriate value.

(Effect 1) It is possible to execute pre-measurement involving internal resonance while reducing the possibility that a crystal defect will occur inside semiconductor laser array 200. Further, it is possible to suppress a decrease in the laser output value of laser oscillator 10 due to external resonance.

(Effect 2) It is possible to reduce the effect of internal resonance when laser is outputted from laser oscillator 10 by external resonance and to suppress a decrease in the laser output value of laser oscillator 10.

Hereinafter, an embodiment of the present disclosure will be described with reference to the accompanying drawings. Note that, the numerical values, shapes, materials, constituent elements, positions at which the constituent elements are disposed, connection forms of the constituent elements, steps, the order of the steps and the like in the embodiment described below are exemplary and are not intended to limit the present disclosure. Accordingly, among the constituent elements in the following embodiment, the constituent elements which are not described in the independent claims indicating the broadest concept of the present disclosure are described as arbitrary constituent elements.

Further, the drawings are schematic diagrams and are not strictly illustrated. Accordingly, the scales or the like in the drawings not necessarily coincide. In each drawing, substantially the same configurations are denoted by the same reference signs, and redundant descriptions thereof will be omitted or simplified.

[Embodiment]

(Configuration of Semiconductor Laser Array)

Figure 4A:
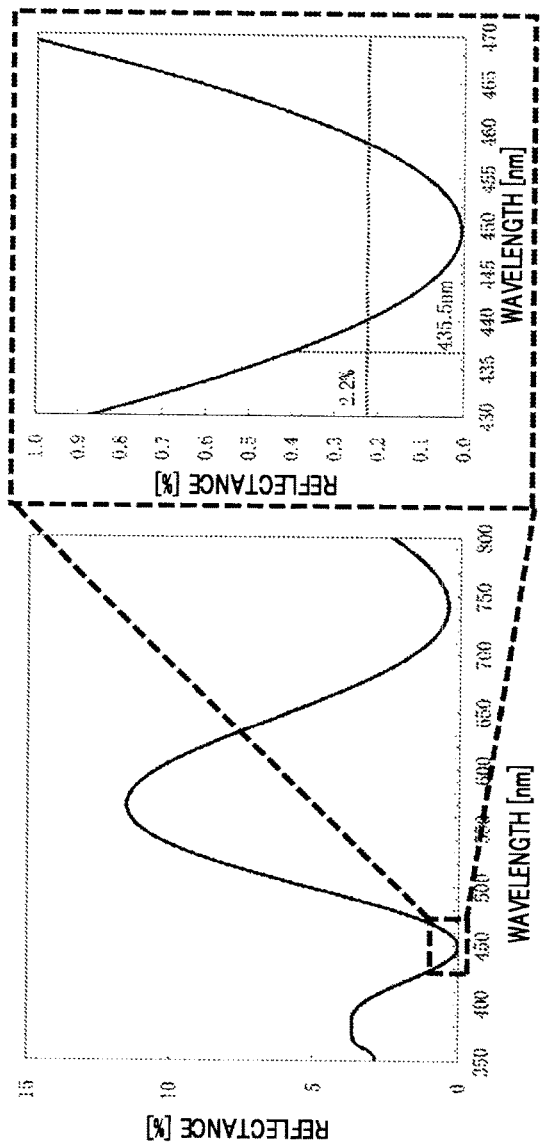
FIGS. 4A and 4B are exemplary profiles indicating each wavelength dependency of reflectance of a reflection film on an emission end surface, for which film thickness conditions different from each other are satisfied.
Figure 4B:
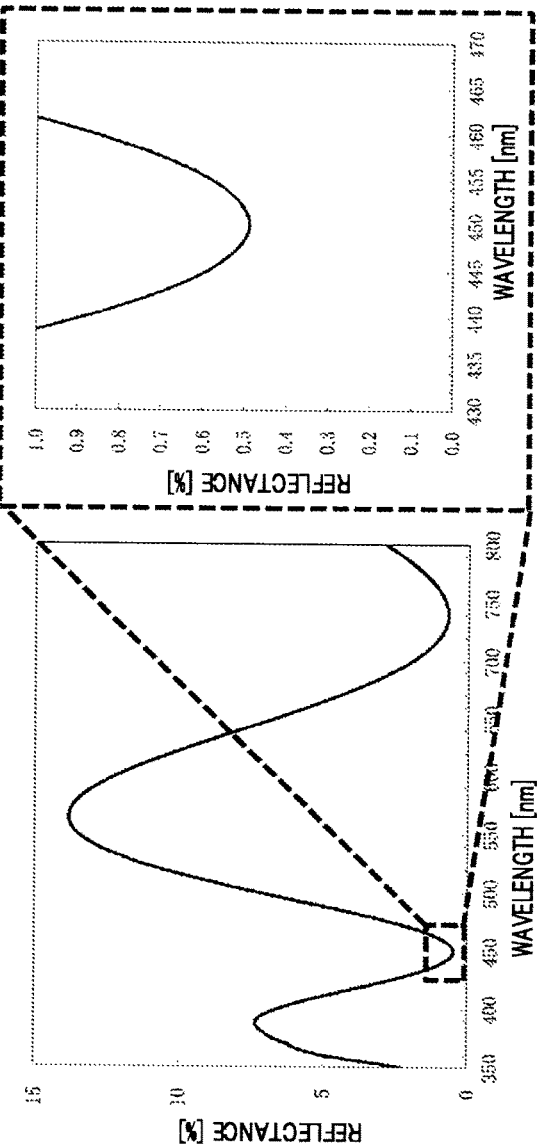
Figure 5:
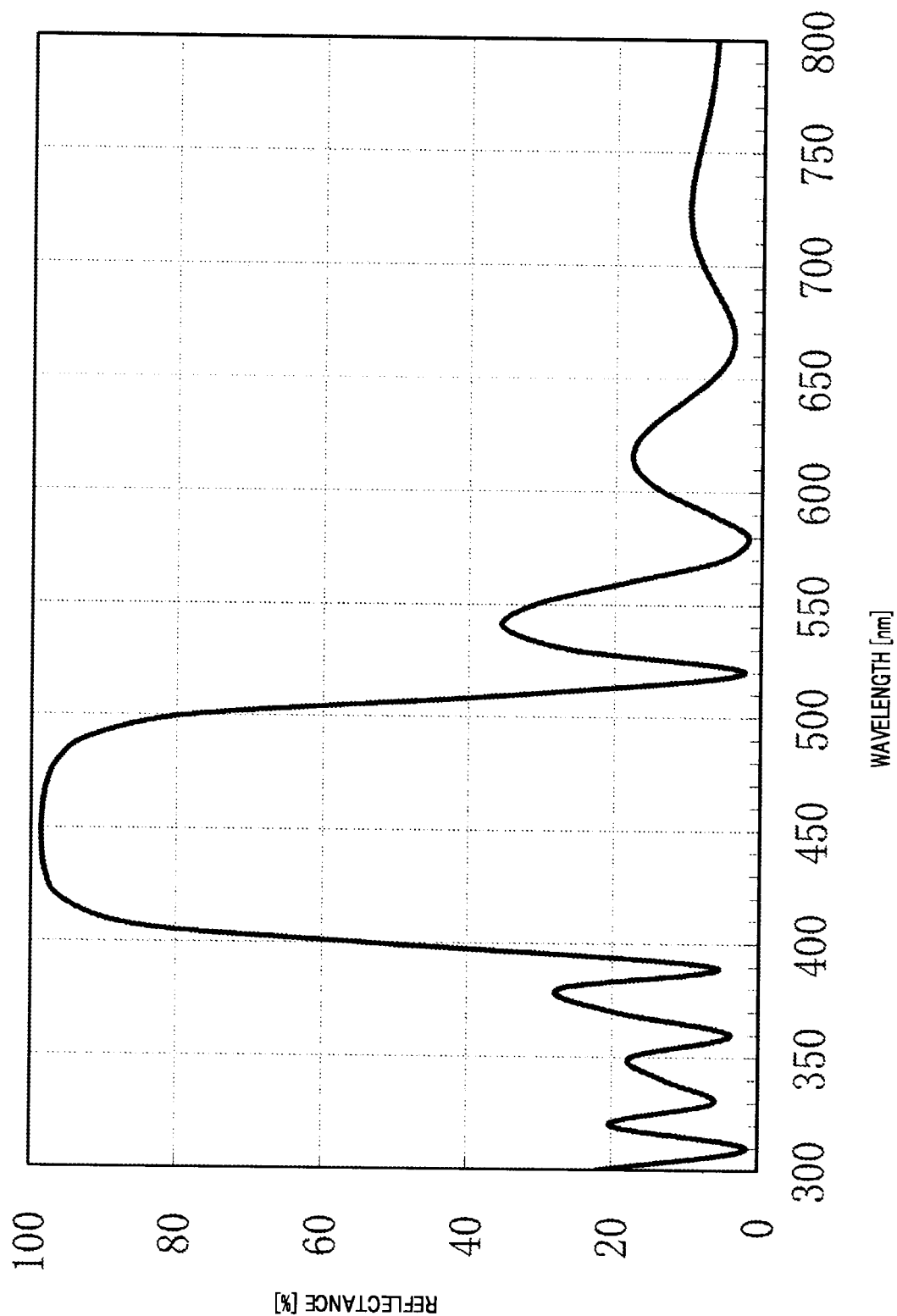
FIG. 5 is an exemplary profile indicating wavelength dependency of reflectance of a reflection film on a non-emission end surface, for which a specific film thickness condition is satisfied.
Figure 6:
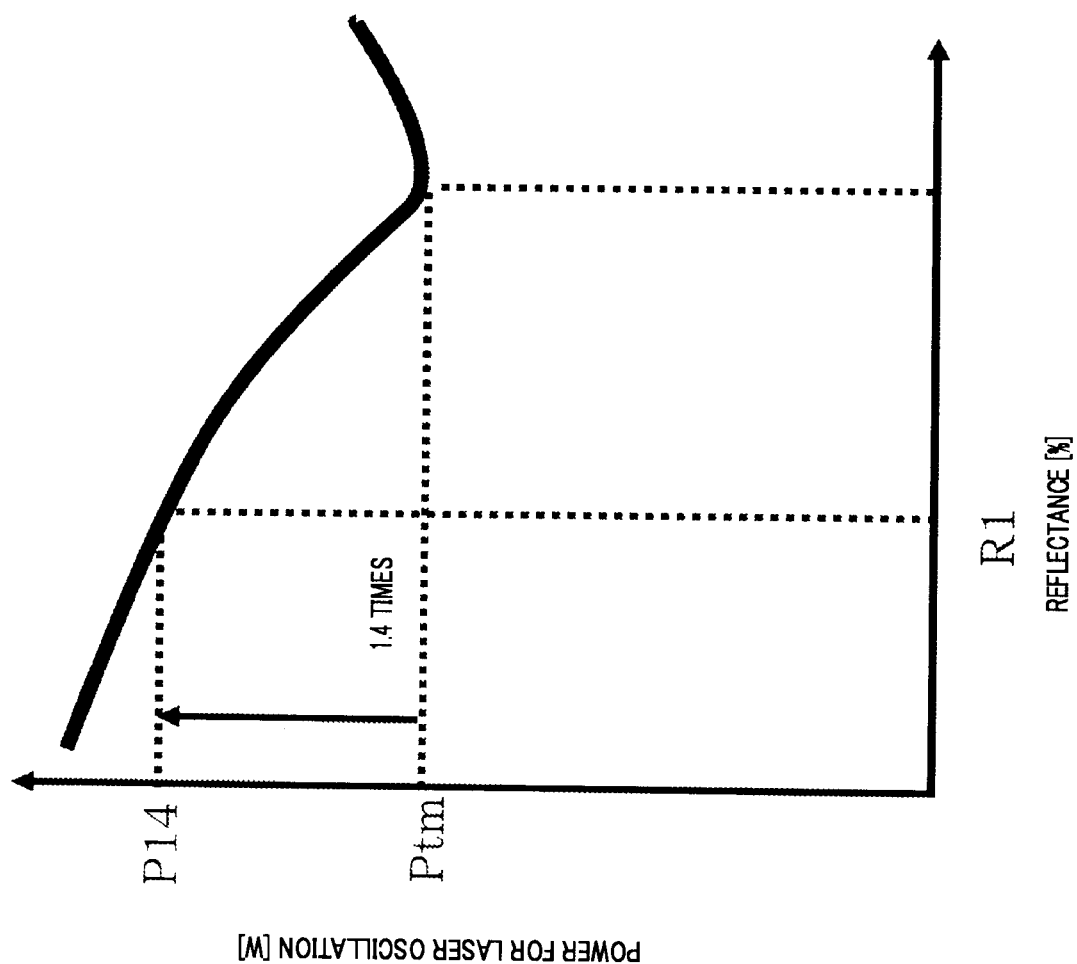
FIG. 6 is a graph illustrating a relationship between threshold power and the reflectance of the reflection film on the emission end surface.

Semiconductor laser array 200 according to the present embodiment will be described in detail with reference to FIGS. 2, 4A, 4B, 5 and 6. FIGS. 4A and 4B are exemplary profiles each indicating wavelength dependency of the reflectance of reflection film 221 on an emission end surface in a case where film thickness conditions different from each other are satisfied. FIG. 5 is an exemplary profile indicating wavelength dependency of reflectance of reflection film 222 on the non-emission end surface for which a specific film thickness condition is satisfied. FIG. 6 is a graph illustrating a relationship between threshold power and the reflectance of reflection film 221 on the emission end surface.

Semiconductor laser array 200 according to the present embodiment will be described as a GaN-based semiconductor laser array that emits laser light 1 in a wavelength bandwidth of equal to or larger than 405 nm and equal to or smaller than 450 nm.

Semiconductor laser array 200 includes substrate 212 and resonator structure 214. Semiconductor laser array 200 is a monolithic semiconductor laser array in which a plurality of emitters 234 is formed on substrate 212 that is a single substrate. Further, reflection films 221 and reflection film 222 are provided on the emission end surface of semiconductor laser array 200 and the non-emission end surface of semiconductor laser array 200 as described above. Further, n-side electrode 219 is formed on a rear surface of substrate 212 and p-side electrode 283 is formed on a front surface of resonator structure 214.

In the present embodiment, substrate 212 is a monocrystalline substrate formed of monocrystalline gallium nitride (GaN) and is, for example, an n-type hexagonal GaN substrate.

First semiconductor layer 216 of resonator structure 214 is, for example, a first cladding layer formed of an n-type semiconductor such as AlGaN.

Light-emitting layer 215 is a layer that emits laser light 1, and has a structure in which a multiquantum well layer is held between guide layers. The multiquantum well layer is formed of, for example, undoped InGaN. The guide layer is formed of, for example, undoped GaN.

The composition ratio of light-emitting layer 215 of resonator structure 214 is adjusted in accordance with the gain wavelength. In a case where laser oscillator 10 included in the processing apparatus according to the present embodiment includes five semiconductor laser arrays 201 to 205 as described above, the lock wavelength has a width such as equal to or larger than 435.9 nm and equal to or smaller than 453.0 nm as illustrated in Table 1 described above, for example. Accordingly, it is necessary to match the gain wavelength with the lock wavelength.

The gain wavelength can be adjusted by adjusting the composition ratio of light-emitting layer 215. Specifically, the gain wavelength can be adjusted by adjusting the In composition ratio of the multiquantum well layer formed of InGaN in light-emitting layer 215. For example, when the In composition ratio is set to 17%, the gain wavelength of semiconductor laser array 200 is 450 nm on average. Note that, a semiconductor laser array with different gain wavelengths may be formed by adjusting the temperature distribution at the time of forming light-emitting layer 215 to adjust the In composition for each emitter 234.

Second semiconductor layer 217 of resonator structure 214 is configured by laminating an electron overflow suppression layer, a second cladding layer, and a contact layer in this order from a side of light-emitting layer 215. The electron overflow suppression layer and the cladding layer are each formed of, for example, a p-type semiconductor such as AlGaN, and the contact layer is formed of, for example, a p-type semiconductor such as GaN. On the contact layers, p-side electrode 283 is disposed.

Next, emitter 234 will be described.

On second semiconductor layer 217, a plurality of projections 233 is formed in a stripe shape. Below projections 233, an optical waveguide section is formed which confines light by the difference in refractive index between light-emitting layer 215 and first semiconductor layer 216 and the difference in refractive index between light-emitting layer 215 and second semiconductor layer 217.

Length x of projection 233 is referred to as a resonator length of semiconductor laser array 200. Semiconductor laser array 200 in the present embodiment is described as a semiconductor laser array which has resonator length x of 2000 μm and array width W of 9000 μm, and in which 40 emitters 234 having a width of 225 μm are formed. The width of projection 233 is, for example, equal to or larger than 10 μm and equal to or smaller than 40 μm, and is specifically 15 μm.

On the upper surface of projection 233, more specifically on the upper surface of the contact layer, p-side electrode 283 is formed and is connected to the upper surface of the optical waveguide section via the contact layer. Above each optical waveguide section, p-side electrode 283 is an electrode in ohmic contact with the contact layer. For example, p-side electrode 283 is formed of a metal material such as Pd, Pt or Ni. In the present embodiment, p-side electrode 283 has a two-layer structure formed of a layer of Pd and a layer of Pt.

The front surface of resonator structure 214 except the upper surface of p-side electrode 283 is coated with an insulation film. Specifically, the insulation film covers, of the upper surface of the contact layer, a region on which p-side electrode 283 is not formed. The insulation film is made of, for example, $SiO_2$ as a material.

Further, semiconductor laser array 200 includes a pad electrode (not illustrated) that covers the entire front surface of resonator structure 214, and a plurality of p-side electrodes 283 is connected to each other by the pad electrode.

Further, n-side electrode 219 is formed so as to cover the entire surface of substrate 212.

The reflectance of reflection film 221 on the emission end surface of semiconductor laser array 200 is set to a predetermined range. The predetermined range will be described later. Further, as will be described later, the reflectance of reflection film 221 is not 0 so that reflection film 221 slightly reflects laser light 1.

Reflection film 221 is a dielectric multilayer film formed by a combination of a silicon dioxide ($SiO_2$) layer and an aluminum oxide ($Al_2O_3$) layer. The reflectance of reflection film 221 can be changed by adjusting the thickness and refractive index of each layer. Note that, the reflectance of reflection film 221 with respect to laser light 1 depends on the wavelength of laser light 1.

For example, in a case where the gain wavelength of semiconductor laser array 200 is 450 nm and reflection film 221 with reflectance of 0.01% is desired to be obtained with respect to the wavelength of 450 nm, the thickness of each layer of reflection film 221 may be adjusted so as to satisfy a first film thickness condition. FIG. 4A illustrates a profile indicating wavelength dependency of the reflectance of reflection film 221 for which the first film thickness condition is satisfied.

In a case where the gain wavelength of semiconductor laser array 200 is 440 nm and reflection film 221 with reflectance of 0.01% is desired to be obtained with respect to the wavelength of 440 nm, the thickness of each layer of reflection film 221 may be adjusted so as to satisfy another film thickness condition.

Further, for example, in a case where the gain wavelength of semiconductor laser array 200 is 450 nm and reflection film 221 with reflectance of 0.5% is desired to be obtained when the wavelength is 450 nm, the thickness of each layer of reflection film 221 may be adjusted so as to satisfy a second film thickness condition. FIG. 4B illustrates a profile indicating wavelength dependency of the reflectance of reflection film 221 for which the second film thickness condition is satisfied.

Reflection film 222 on the non-emission end surface of semiconductor laser array 200 is a dielectric multilayer film formed by a combination of an $SiO_2$ layer and an aluminum oxynitride (AlON) layer. The reflectance of reflection film 222 can be changed by adjusting the thickness and refractive index of each layer in the same manner as with reflection film 221. Note that, the reflectance of reflection film 222 with respect to laser light 1 also depends on the wavelength of laser light 1 in the same manner as with the reflectance of reflection film 221.

For example, in a case where the gain wavelength of semiconductor laser array 200 is 450 nm and reflection film 222 with reflectance of 98.7% is desired to be obtained when the wavelength is 450 nm, the thickness of each layer of reflection film 222 may be adjusted so as to satisfy a third film thickness condition. FIG. 5 illustrates a profile indicating wavelength dependency of the reflectance of reflection film 222 for which the third film thickness condition is satisfied.

<Output of Semiconductor Laser Array>

When a current of 60 A is injected into semiconductor laser array 200 according to the present embodiment, a laser output in which the sum of laser lights 1 from emitters 234 becomes equal to or larger than 70 W and equal to or smaller than 88 W can be obtained.

Since semiconductor laser array 200 includes 40 emitters 234, a high laser output value of at most 2.2 W (88 W divided by 40) from one emitter 234 is obtained when a current of 1.5 A (that is, 60 A divided by 40) is injected into the one emitter 234.

<Reflectance of Reflection Film on Emission End Surface>

The reflectance of reflection film 221 on the emission end surface will be described. In the present embodiment, reflectance R of reflection film 221 on the emission end surface at the gain wavelength of semiconductor laser array 200 satisfies relational expression 1.

$$R1 \leq R \leq R(Oc) \times C \qquad \text{(Relational Expression 1)}$$

In relational expression 1, R1 is the reflectance of reflection film 221 on the emission end surface when light-emitting layer 215 performs laser oscillation with power P14. As illustrated in FIG. 6, power P14 is power 1.4 times minimum threshold power Ptm which is a minimum value of threshold power for light-emitting layer 215 to perform laser oscillation. R(Oc) is reflectance of external resonance mirror 210. C is a ratio of light 4, which is reflected by external resonance mirror 210, returns to semiconductor laser array 200, and is incident in the optical waveguide section of semiconductor laser array 200, to light 4 which is reflected by external resonance mirror 210 and returns to semiconductor laser array 200 (hereinafter the ratio will be referred to as "coupling efficiency").

(Semiconductor Laser Element)

Figure 7:
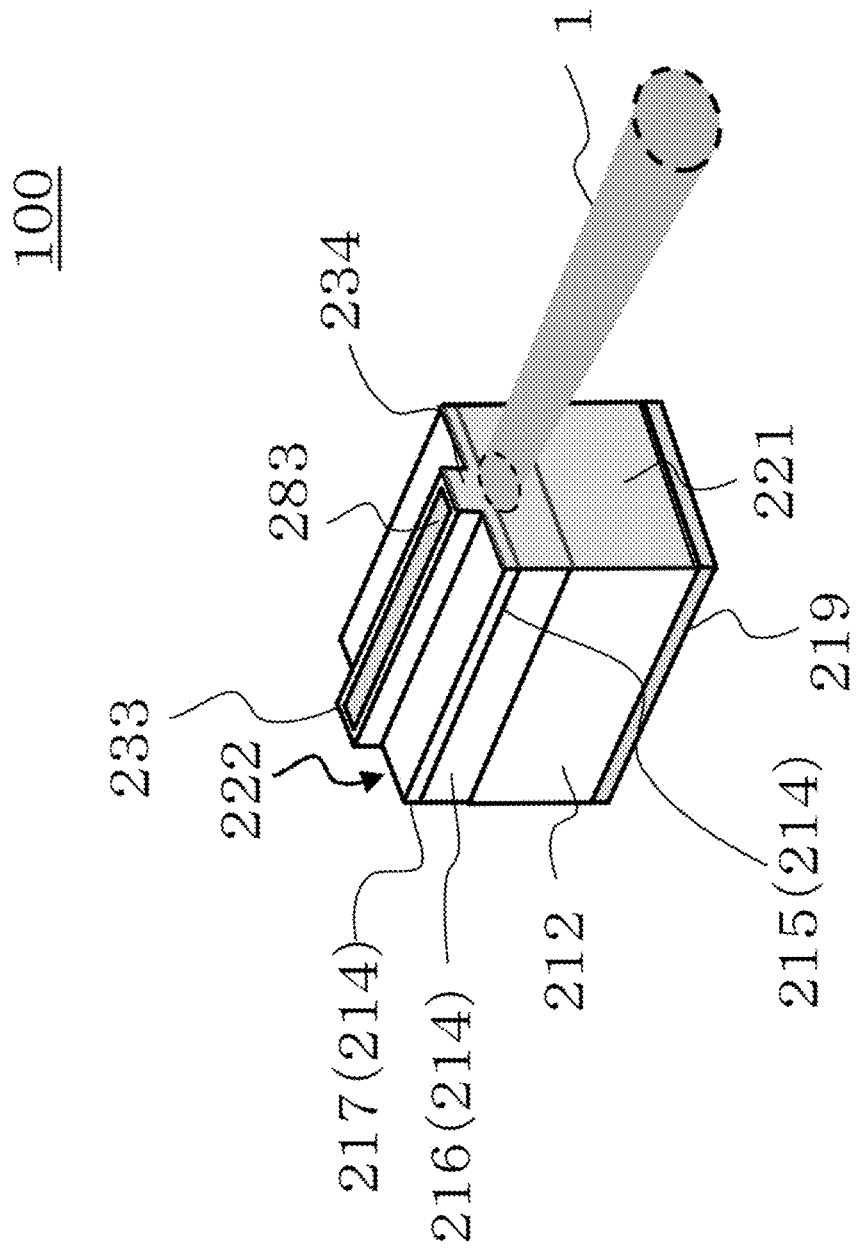
FIG. 7 illustrates a semiconductor laser element according to the embodiment.

Semiconductor laser element 100 according to the present embodiment will be described with reference to FIG. 7. FIG. 7 illustrates semiconductor laser element 100 according to the embodiment.

In the same manner as with semiconductor laser array 200, semiconductor laser element 100 includes n-side electrode 219, substrate 212, resonator structure 214, p-side electrode 283, reflection film 221, and reflection film 222. In resonator structure 214 of semiconductor laser element 100, only one projection 233, that is, one emitter 234, is formed. Features of the other configurations in semiconductor laser element 100 are the same as those in semiconductor laser array 200.

Note that, it can also be said that semiconductor laser array 200 includes a plurality of semiconductor laser element 100 each of which includes one emitter 234.

(Method of Producing Semiconductor Laser Array)

Figure 8:
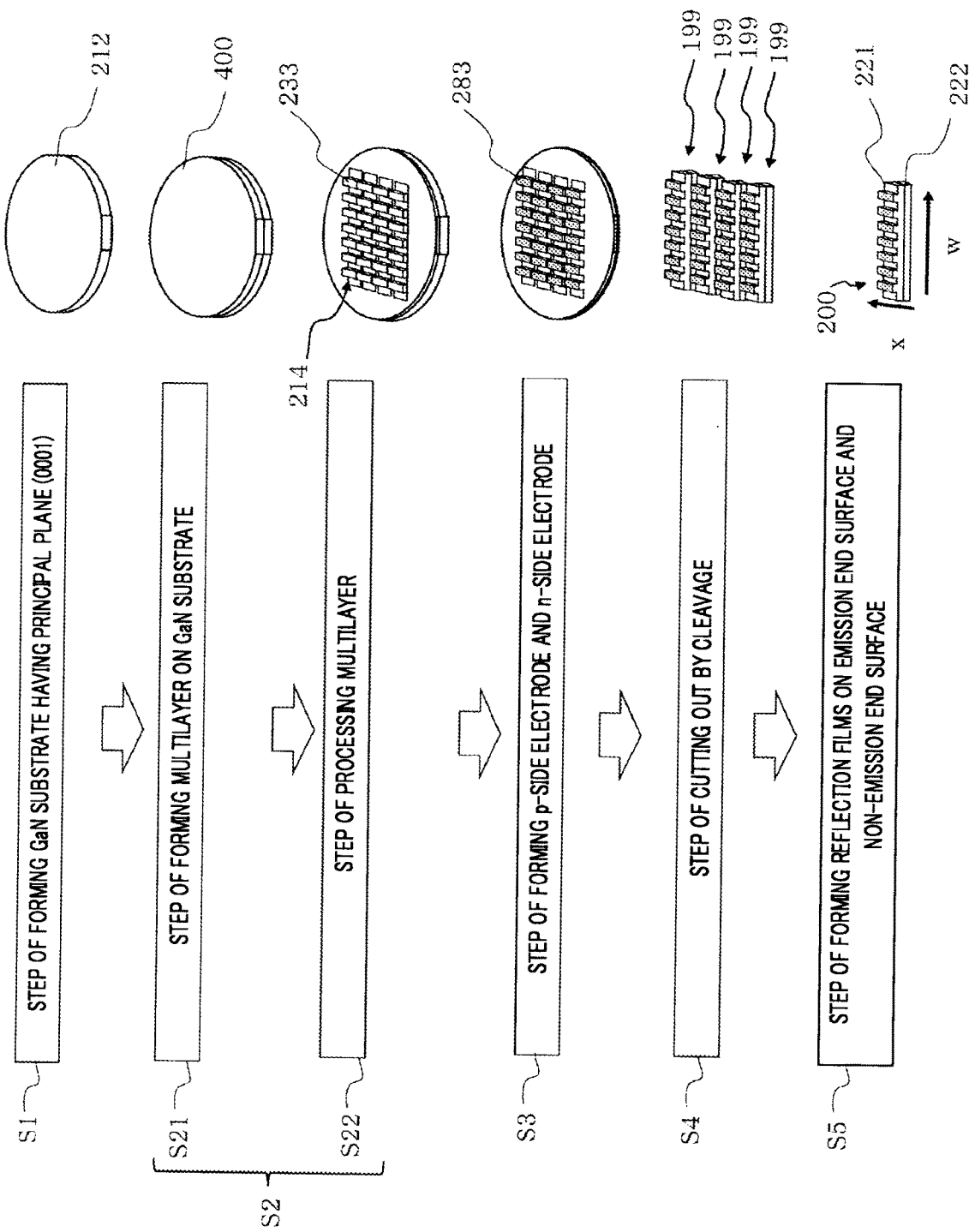
FIG. 8 illustrates production steps of the semiconductor laser array according to the embodiment.

Next, a method of producing semiconductor laser array 200 will be described with reference to FIG. 8. FIG. 8 illustrates production steps of semiconductor laser array 200 according to the embodiment.

<Step S1>

First, an n-type hexagonal GaN substrate (substrate 212) whose principal plane is a (0001) plane is formed. Here, the thickness of substrate 212 is, for example, 400 μm.

<Step S2>

Next, resonator structure 214 is formed on substrate 212. Step S2 includes steps S21 and S22.

<<Step S21>>

First, multilayer 400 is formed on substrate 212 by growing crystals by a Metalorganic Chemical Vapor Deposition (MOCVD) method. Specifically, first semiconductor layer 216, which is a first cladding layer, light-emitting layer 215, and second semiconductor layer 217 are formed.

Note that, in a case where light-emitting layer 215 is formed of InGaN, semiconductor laser array 200 having gain wavelengths are different for each emitter 234 can be obtained in a range of equal to or larger than 400 nm and equal to or smaller than 450 nm by setting the In composition to approximately equal to or larger than 10% and equal to or smaller than 17% in step S21.

<<Step S22>>

Next, an etching mask having a width of 15 μm is formed in a stripe shape on the front surface of multilayer 400 by using common photolithography. Then, dry etching using chlorine-based gas is performed on second semiconductor layer 217 of multilayer 400. In this etching, the objects to be etched are a contact layer (the uppermost layer of second semiconductor layer 217) and a cladding layer (the layer immediately below the contact layer), and the depth of the etching corresponds to a film thickness from the uppermost surface of the contact layer to the lowermost surface of the contact layer. Thus, numerous projections 233 are formed in multilayer 400.

Thus, resonator structure 214 is formed on the front surface of substrate 212. This resonator structure 214 includes 20 emitters 234 in which the width of projection 233 is 15 μm and the resonator length is 2000 mm.

<Step S3>

An insulation film is formed on the front surface of resonator structure 214 by using a CVD method or the like. This insulation film is a silicon dioxide ($SiO_2$) layer. Then, common photolithography is executed to remove the insulation film in a predetermined region of projection 233.

On the region from which the insulation film of projection 233 has been removed, p-side electrode 283 is formed by using Pd and Pt as materials. Further, a pad electrode is formed so as to connect a plurality of p-side electrodes 283.

Then, substrate 212 is polished or etched from the (000-1) plane (the rear surface of substrate 212) so as to have a thickness of approximately 100 μm. By thinning substrate 212, it is possible to enhance the heat dissipation property of semiconductor laser array 200 to be finally completed.

Next, n-side electrode 219 is formed by depositing titanium and gold on the rear surface of substrate 212 and performing alloy processing.

<Step S4>

Next, substrate 212 is cleaved by utilizing cleavability of an m plane of substrate 212 to cut out a plurality of array bodies 199 each of which is formed of substrate 212, resonator structure 214, p-side electrode 283, and n-side electrode 219. In the present embodiment, array bodies 199 in which resonator length x is 2000 μm and array width W is 9000 μm and each of which includes 40 projections 233 are cut out.

<Step S5>

Then, reflection film 221 having reflectance in a predetermined range is formed by laminating an SiO$_2$ layer and an Al$_2$O$_3$ layer on each emission end surface of array bodies 199.

Further, reflection film 222 is formed by laminating an SiO$_2$ layer and an AlON layer on each non-emission end surface of array bodies 199.

As described above, semiconductor laser array 200 is formed by steps S1 to S5.

Note that, semiconductor laser elements 100 can be obtained by dividing array bodies 199 to form element bodies each of which includes only one emitter 234, forming reflection film 221 on each emission end surface of the element bodies, and forming reflection film 222 on each non-emission end surface of the element bodies.

(Configuration of Laser Module)

Figure 9B:
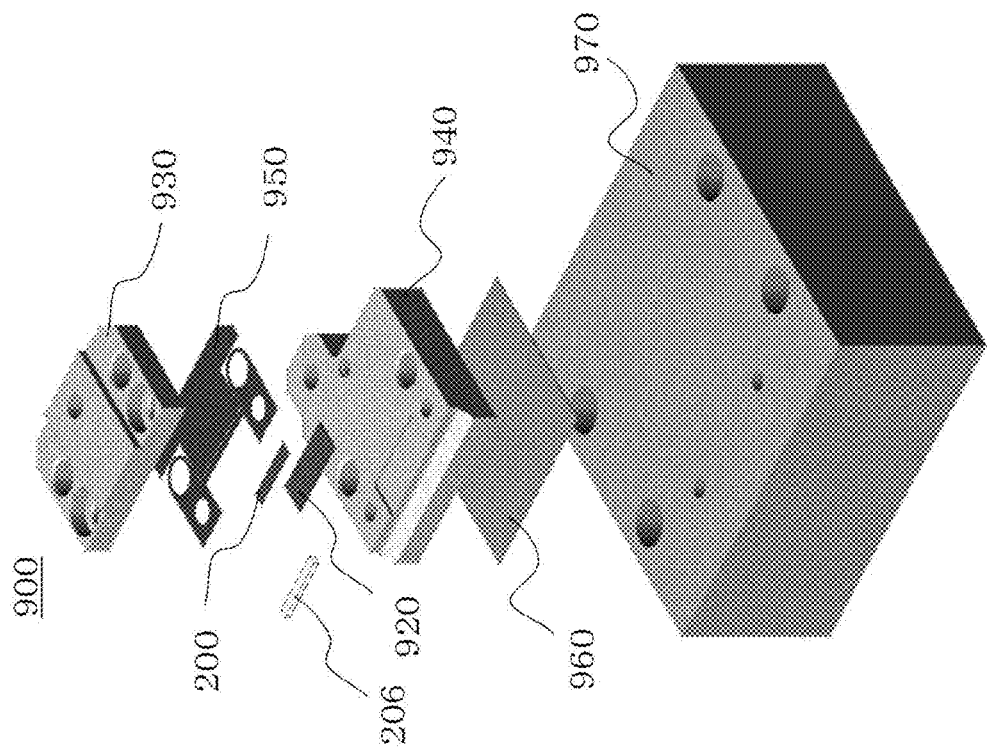
FIGS. 9A and 9B are a perspective view of a laser module and an exploded perspective view of the laser module, respectively.
Figure 9A:
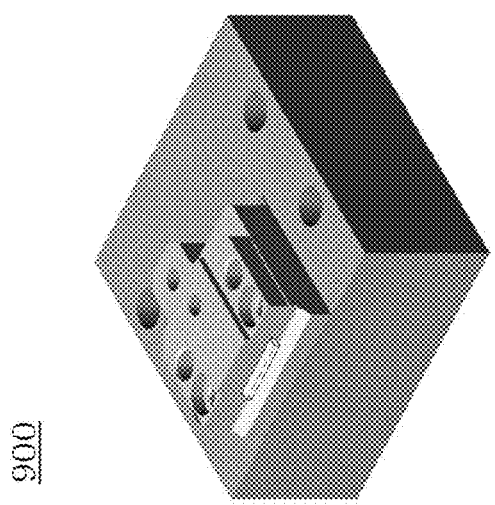

Hereinafter, laser module 900 equipped with semiconductor laser array 200 according to the present embodiment will be described with reference to FIGS. 9A and 9B. FIG. 9A is a perspective view of laser module 900, and FIG. 9B is an exploded perspective view of laser module 900.

Figure 10:
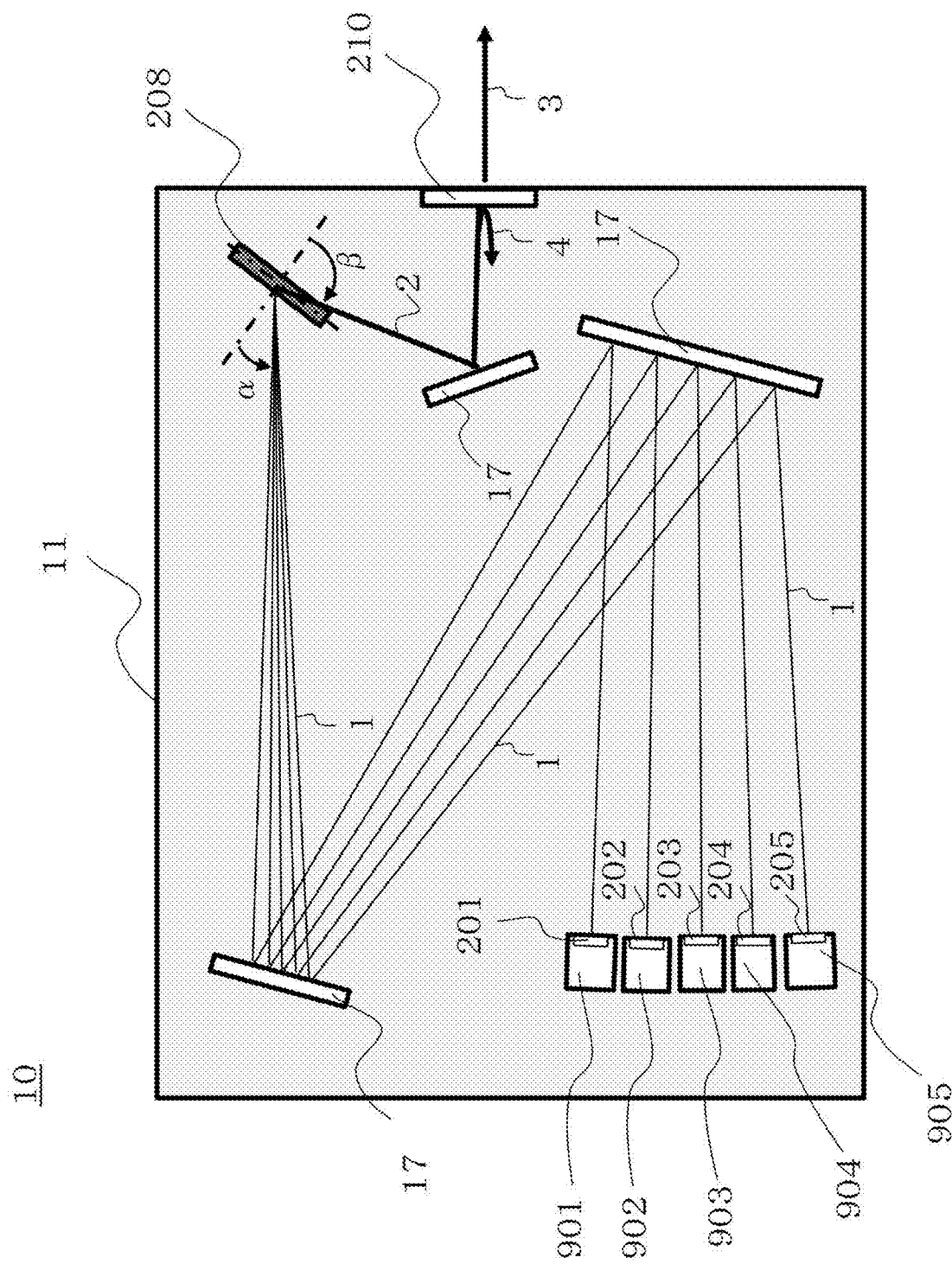
FIG. 10 illustrates the high-output laser oscillator used in the processing apparatus according to the embodiment.

Laser module 900 is mounted in laser oscillator 10 (see FIG. 10).

In the present embodiment, laser module 900 includes upper-side metal block 930, lower-side metal block 940, heat conductive sheet 960, and water-cooled pedestal 970, and is configured as a module of a high heat dissipation system, which performs cooling by water cooling. Hereinafter, details thereof will be described.

Upper-side metal block 930 and lower-side metal block 940 are metal blocks with high heat dissipation property and are formed of, for example, copper. Upper-side metal block 930 and lower-side metal block 940 are disposed on the upper and lower sides of semiconductor laser array 200, respectively. Heat conductive sheet 960 has insulation property.

Laser module 900 has a structure that allows semiconductor laser array 200 to be cooled from water-cooled pedestal 970 via heat conductive sheet 960 and lower-side metal block 940.

Laser module 900 further includes submount 920 and insulation sheet 950. Submount 920 and insulation sheet 950, together with semiconductor laser array 200, are disposed between upper-side metal block 930 and lower-side metal block 940.

Since semiconductor laser array 200 includes a plurality of emitters 234, the power required to perform laser oscillation may be equal to or larger than several tens of watts. Thus, submount 920 may be formed of a conductive material so that submount 920 may be caused to function as a current path. For example, submount 920 is formed of a high heat dissipating material, for example, silicon carbide.

Submount 920 may be formed of an insulating material. In this case, metal plating such as gold plating and copper plating may be performed on the front surface of submount 920, which is connected to semiconductor laser array 200, to ensured conductivity.

Note that, upper-side metal block 930 and lower-side metal block 940 connect p-side electrode 283 and n-side electrode 219 to positive and negative electrodes of a power supply apparatus (not illustrated), respectively.

Beam twister unit 206 is disposed on a side of the emission end surface of semiconductor laser array 200. Beam twister unit 206 rotates a plurality of laser lights 1 emitted from semiconductor laser array 200 by 90°, respectively, to prevent individual laser lights 1 having close wavelengths from interfering with each other.

When a pulse current of 60 A is injected into laser module 900 according to the present embodiment, it is possible to obtain laser light 1 of equal to or larger than 60 W and equal to or smaller than 80 W, which means that a current of 1.5 A is injected into one emitter 234. As a result, light output of at most 2.0 W (80 W divided by 40 (the number of emitters 234)) can be obtained from one emitter 234.

(Configuration of Laser Oscillator)

The processing apparatus according to the present embodiment includes laser oscillator 10. Hereinafter, laser oscillator 10 according to the present embodiment will be described with reference to FIG. 10. FIG. 10 illustrates laser oscillator 10 used in the processing apparatus according to the present embodiment. Note that, the path of cooling water and the power supply apparatus are omitted from FIG. 10.

Laser oscillator 10 includes five laser modules 901 to 905. Laser module 900 described above is applied to laser modules 901 to 905, respectively. Further, FIG. 10 indicates that semiconductor laser arrays 201 to 205 are mounted in laser modules 901 to 905, respectively.

Laser oscillator 10 further includes housing 11, a plurality of mirrors 17, diffraction grating 208, and external resonance mirror 210.

Housing 11 is made of, for example, stainless steel, and laser modules 901 to 905 are disposed inside housing 11. Actually, laser modules 901 to 905 are arranged in a fan shape. FIG. 10 indicates that laser module 901, laser module 902, laser module 903, laser module 904 and laser module 905 are arranged in this order. A current is injected in series from the power supply apparatus into laser modules 901 to 905 each of which emits laser light 1.

The plurality of mirrors 17, diffraction grating 208, and external resonance mirror 210 are disposed inside housing 11.

Laser lights 1 emitted from laser modules 901 to 905 are collected at diffraction grating 208 by the plurality of mirrors 17. In the present embodiment, diffraction grating 208 is a transmission type diffraction grating and is disposed such that the distance (optical path length) between the emission end surfaces of semiconductor laser arrays 201 to 205 and diffraction grating 208 is 2.6 m.

Incident angle α of laser light 1 on diffraction grating 208 depends on the position of the laser module from which laser light 1 is emitted. Incident angles α of laser lights 1 from laser modules 901, 902, 903, 904 and 905 are 21.6°, 22.4°, 23.2°, 24.0° and 24.8°, respectively, and change in increments of 0.8°. Output angle β of external resonance light 2 emitted from diffraction grating 208 is 70°.

Conditions such as the lock wavelengths of semiconductor laser arrays 201 to 205 in laser oscillator 10 according to the present embodiment, the groove periods of diffraction grating, and the lattice constants are indicated in Table 3 below.

TABLE 3

| | Configuration of High-Output Laser Oscillator used in Wavelength Beam Combining Type Processing Apparatus | | | | | | | | Calculated Value | | |
|---|---|---|---|---|---|---|---|---|---|---|---|
| | | | | | | | | | Lock Wavelength of Semiconductor Laser Array | | |
| Item Unit | Semiconductor Laser Array Reference Sign | Diffraction Grating Groove Period Lines/mm | Diffraction Grating Period d μm | Output Angle β deg | Incident Angle α deg | Degree m — | sin β — | sin α — | Center nm | Left end nm | Right end nm |
| | 201 | 3000 | 0.333 | 70 | 21.6 | 1 | 0.940 | 0.368 | 435.9 | 435.4 | 436.4 |
| | 202 | 3000 | 0.333 | 70 | 22.4 | 1 | 0.940 | 0.381 | 440.3 | 439.8 | 440.8 |
| | 203 | 3000 | 0.333 | 70 | 23.2 | 1 | 0.940 | 0.394 | 444.5 | 444.0 | 445.0 |
| | 204 | 3000 | 0.333 | 70 | 24.0 | 1 | 0.940 | 0.407 | 448.8 | 448.3 | 449.3 |
| | 205 | 3000 | 0.333 | 70 | 24.8 | 1 | 0.940 | 0.419 | 453.0 | 452.5 | 453.5 |

Laser oscillator 10 produces resonance between external resonance mirror 210 and reflection films 222 on the non-emission end surfaces of semiconductor laser arrays 201 to 205, and causes part of the resonance to be emitted as laser light 3. Note that, the reflectance of external resonance mirror 210 is set to 15%.

In laser oscillator 10, the coupling efficiency is set to approximately 15% by adjusting the optical axes of mirror 17 and an optical component (not illustrated).

(Method of Producing Laser Oscillator)

Laser oscillator 10 described above is assembled as follows. First, housing 11 is prepared which is capable of housing a plurality of laser modules 900, diffraction grating 208, a plurality of mirrors 17, and external resonance mirror 210, and which has such a capacity that the positions at which the plurality of laser modules 900, diffraction grating 208, the plurality of mirrors 17, and external resonance mirror 210 are disposed can be fine-tuned.

Next, the plurality of mirrors 17, diffraction grating 208, and external resonance mirror 210 are disposed. At this time, the positions of the plurality of mirrors 17, diffraction grating 208, and external resonance mirror 210 are adjusted, and optical axis adjustment is performed in order to prevent an optical axis shift from occurring at the time of external resonance.

Then, the plurality of laser modules 900 is prepared. Further, pre-measurement is performed on semiconductor laser array 200 included in each laser module 900 that has been prepared. In the pre-measurement, internal resonance is generated at semiconductor laser array 200 and laser oscillation is caused.

In the pre-measurement, it is desirable to measure the gain wavelengths at each right end section (one end section), each left end section (another end section), and each center section of semiconductor laser array 200 at current values used by laser oscillator 10, which is because the current flows so that emitter 234 generates heat, the band gap, that is, the gain wavelength of light-emitting layer 215 of semiconductor laser array 200 changes, and as a result the gain wavelength varies depending on the position of semiconductor laser array 200.

Further, since the output value and the various properties change depending on how well semiconductor laser array 200 is produced, it is desirable to measure light outputs at constant current values, and threshold currents and threshold voltages, that is, threshold power, required for laser oscillation.

Laser modules 900 including semiconductor laser array 200 whose gain wavelength coincides with the lock wavelength of laser oscillator 10 are selected based on the measured values of gain wavelengths. At this time, it is desirable to select laser module 900 including semiconductor laser array 200 that allows light output to be efficiently obtained by internal resonance. Laser modules 900 that have been selected are used as laser modules 901 to 905.

Then, laser modules 901 to 905 are disposed at appropriate positions inside housing 11. Thereafter, a lid (not illustrated) of housing 11 is closed such that scattered light does not leak outside housing 11.

Thus, laser oscillator 10 is completed. Thereafter, after a cooling mechanism of laser oscillator 10 is caused to function, the power supply of the power supply apparatus is turned on, and it is evaluated how well laser oscillator 10 is produced by measuring the output value and quality of laser light 3 emitted from external resonance mirror 210.

Note that, although laser module 900 has been described as including semiconductor laser array 200 (that is, a plurality of semiconductor laser elements 100), laser module 900 may include one semiconductor laser element 100. That is, laser oscillator 10 may include a plurality of laser modules 900 each of which includes only one semiconductor laser element 100.

[Example]

Next, the grounds for relational expression 1 will be described based on an example with reference to FIGS. 11 to 13, 14A and 14B.

Figure 11:
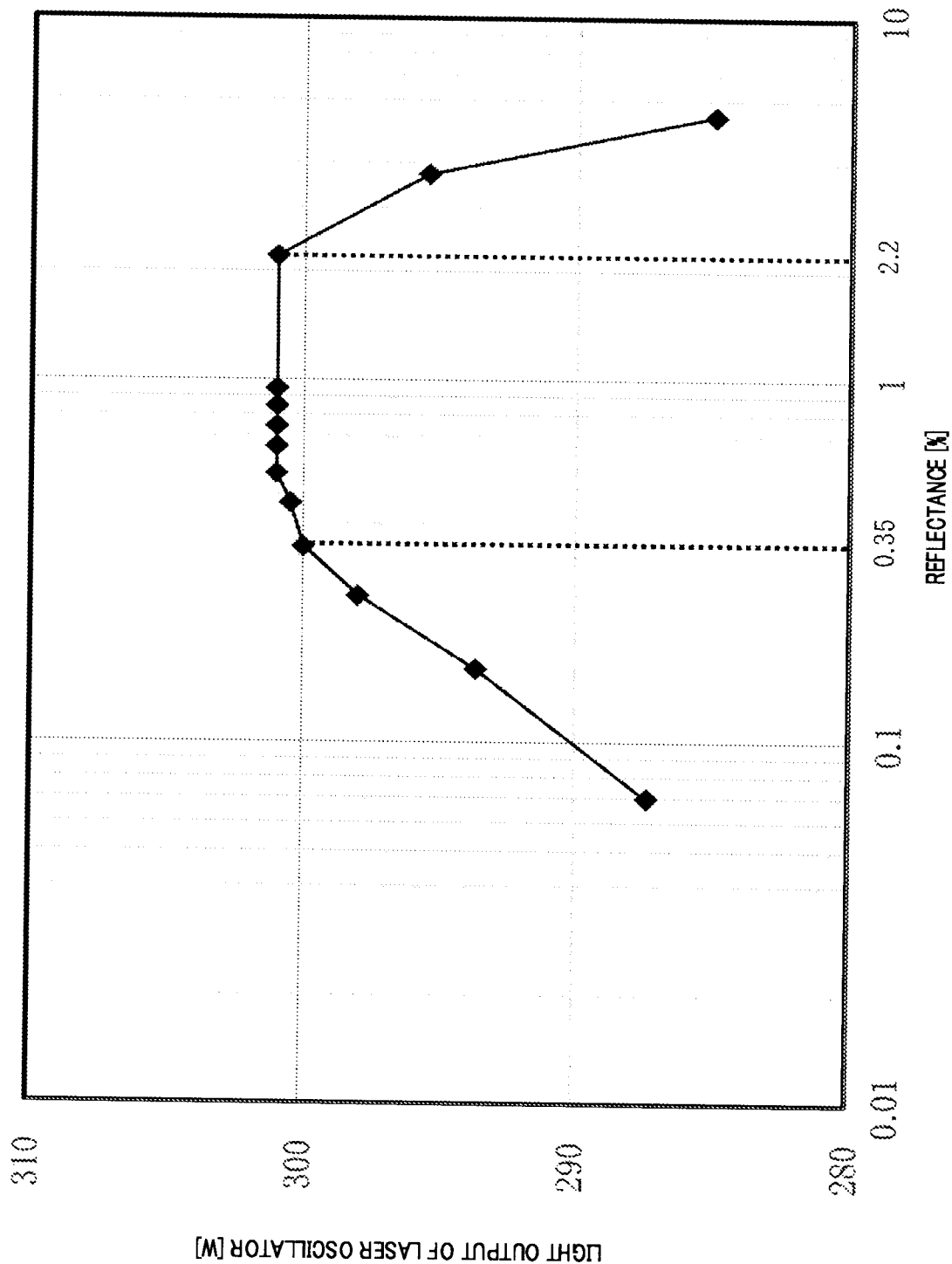
FIG. 11 illustrates a relationship between reflectance of a reflection film on an emission end surface of a semiconductor laser array and light output of a high-output laser oscillator used in the processing apparatus according to an example.
Figure 12:
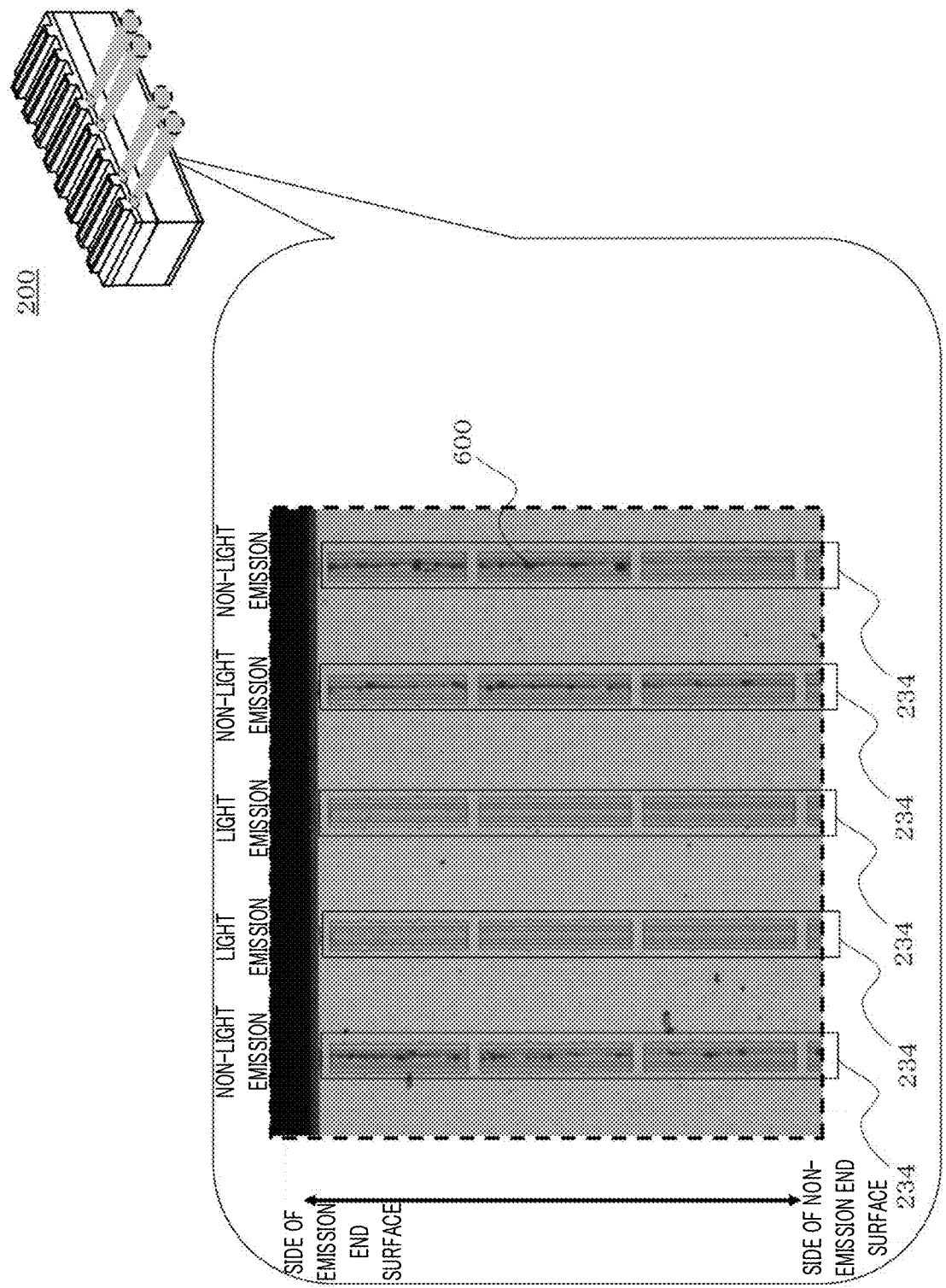
FIG. 12 illustrates emitters of the semiconductor laser array according to the example when viewed from a side of an n-side electrode with illustration of the vicinity of the emission end surface.
Figure 13:
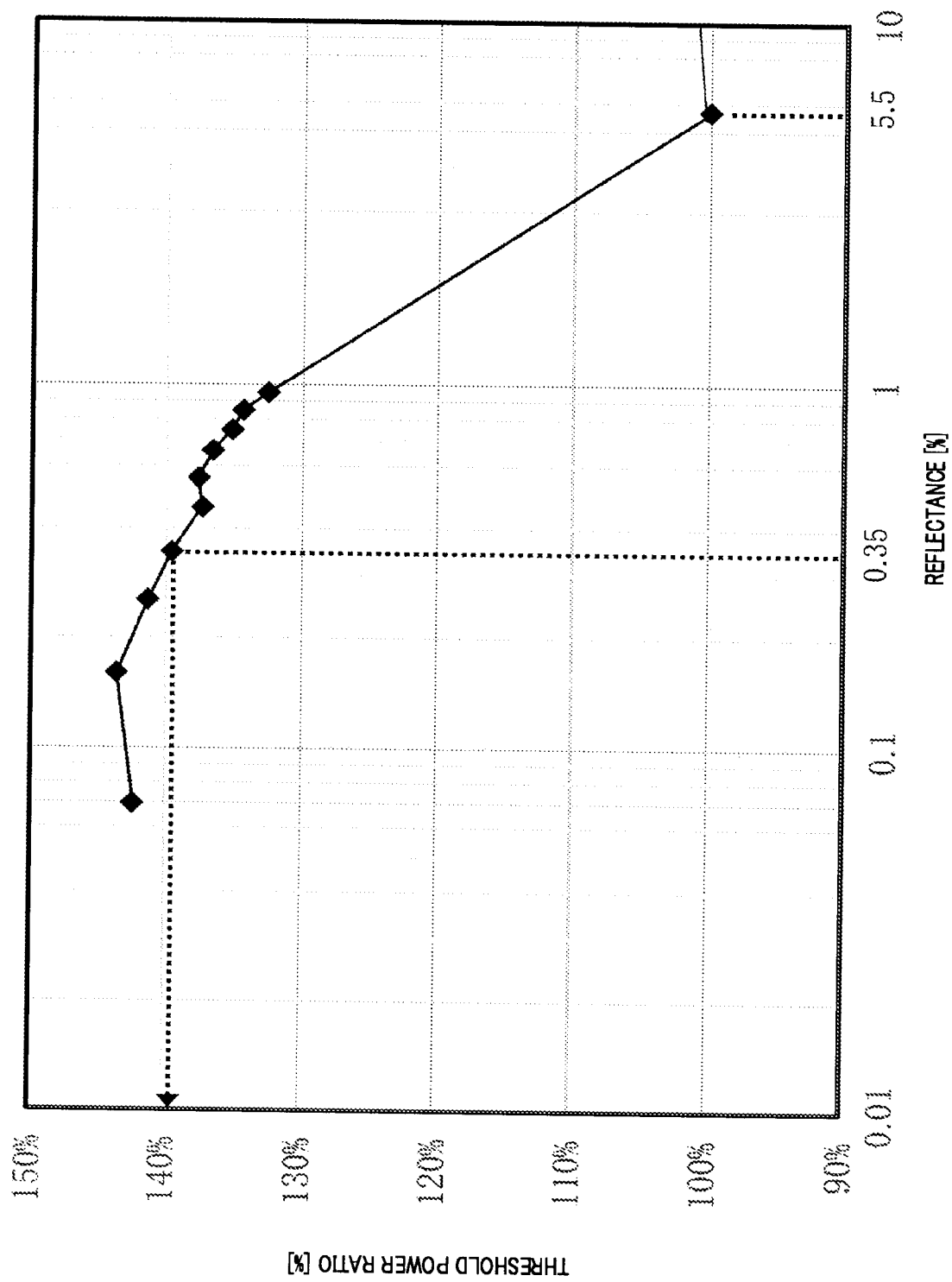
FIG. 13 illustrates a relationship between threshold power and the reflectance of the reflection film on the emission end surface in the semiconductor laser array according to the example.
Figure 14A:
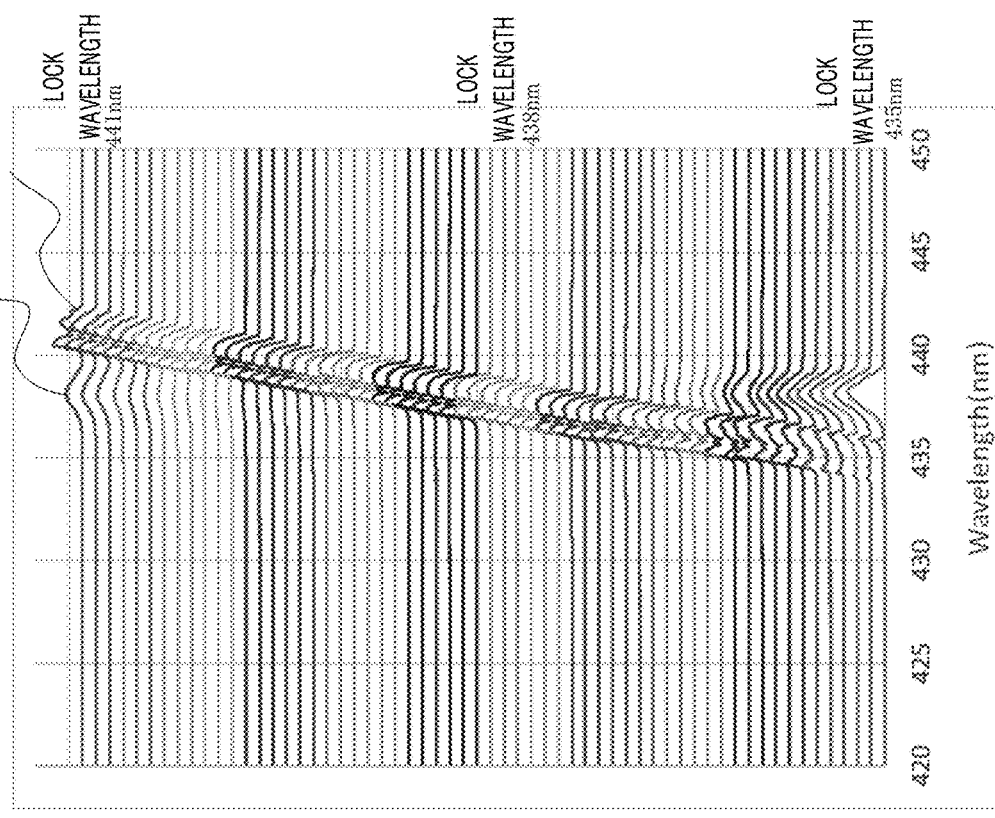
FIGS. 14A and 14B illustrate wavelength spectra of laser light outputted from a high-output laser oscillator used in the processing apparatus according to the example by external resonance under conditions different from each other.
Figure 14B:
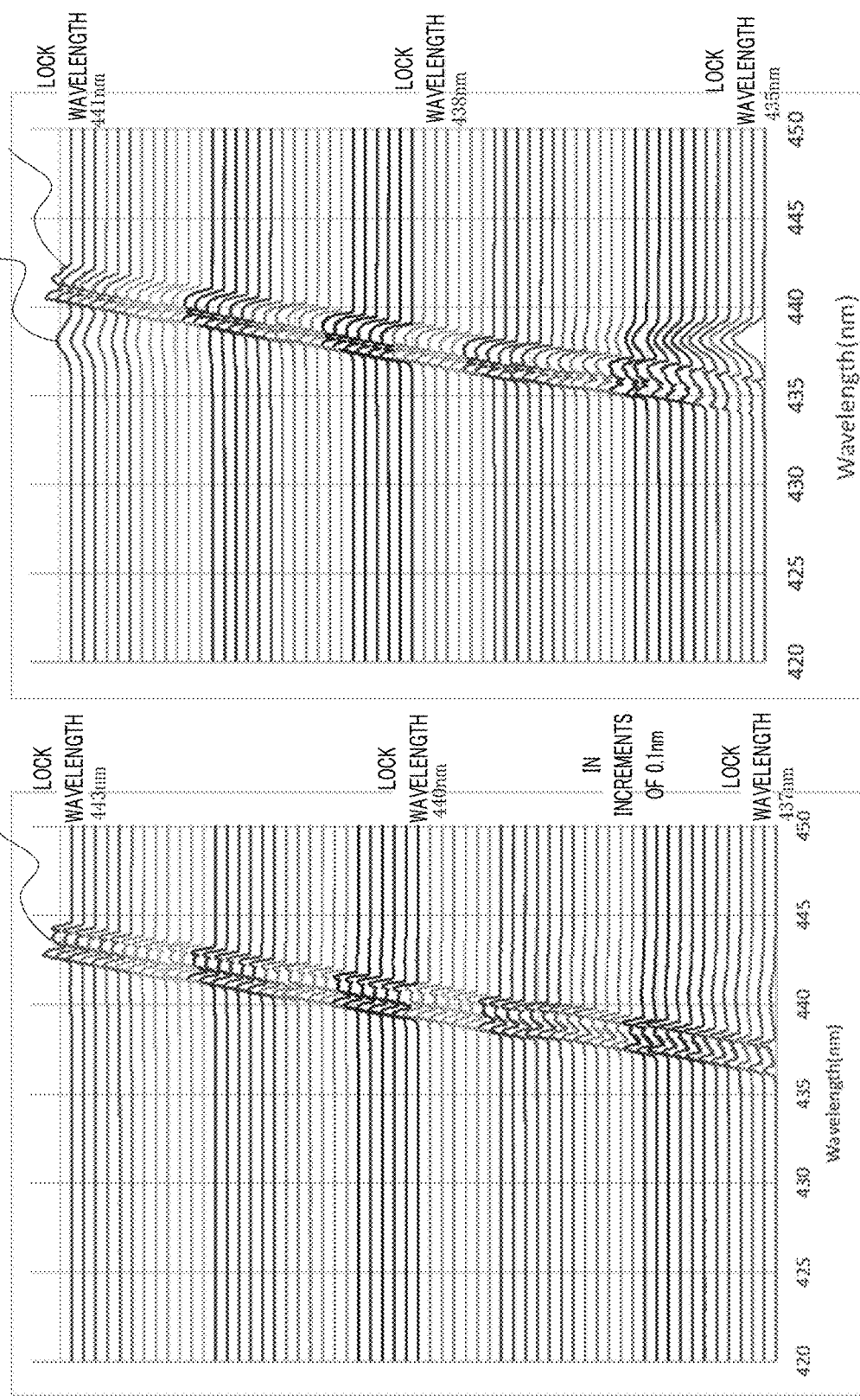

FIG. 11 illustrates a relationship between the reflectance of reflection film 221 on the emission end surface of semiconductor laser array 200 and light output of laser oscillator 10 used in the processing apparatus according to the example. FIG. 12 is a diagram when emitters 234 of semiconductor laser array 200 according to the example are viewed from a side of n-side electrode 219 with illustration of the vicinity of the emission end surface. FIG. 13 illustrates a relationship between threshold power and the reflectance of reflection film 221 on the emission end surface in semiconductor laser array 200 according to the example. The vertical axis of FIG. 13 indicates the ratio of the threshold power (hereinafter referred to as "threshold power ratio") when a minimum value of threshold power (that is, Ptm) is 100%. The horizontal axis of FIG. 13 indicates the reflectance of reflection film 221 on the emission end surface. FIGS. 14A and 14B illustrate wavelength spectra of laser light outputted from laser oscillator 10 used in the processing apparatus according to the example by external resonance. FIG. 14A illustrates spectra obtained under conditions that the reflectance of reflection film 221 on the emission end surface is 0.16% and the gain wavelength is 440 nm. FIG. 14B illustrates spectra obtained under conditions that the reflectance of reflection film 221 on the emission end surface is 3.3% and the gain wavelength is 438 nm.

In the present example, laser module 900 was equipped with semiconductor laser array 200 and laser oscillator 10 in which a plurality of laser modules 900 was mounted was produced in accordance with the embodiment described above.

First, ten sets of (a total of 150) semiconductor laser array 200 for which the reflectance of reflection film 221 on the emission end surface was set to 0.07%, 0.16%, 0.25%, 0.35%, 0.46%, 0.55%, 0.66%, 0.75%, 0.85%, 0.95%, 1.0%, 2.2%, 3.3%, 4.0%, and 5.5%, respectively, were prepared. Note that, it was set such that the reflectance of reflection film 221 was changed by changing the film thickness configuration of a dielectric layer that forms reflection film 221 to result in 15 levels of reflectance. Note that, each semiconductor laser array 200 having the same reflectance has properties substantially identical to each other, with coincidence with the lock wavelengths in Table 3 described above.

Next, one laser module 900 was equipped with one semiconductor laser array 200 to form 150 laser modules 900. Then, each semiconductor laser array 200 was caused to perform laser oscillation by internal resonance. Further, five laser modules 900 each of which includes semiconductor laser array 200 with coincidence of the lock wavelength and the gain wavelength were selected from ten laser modules 900 in each level.

Then, laser oscillator 10 was produced for each set of 15 levels by using laser modules 900 having been selected. Note that, optical axis adjustment was performed when laser modules 900 having been selected were disposed.

Thereafter, in each laser oscillator 10, the cooling mechanism was caused to function, the power was turned on, and the output value of laser light 3 emitted from external resonance mirror 210 was measured.

It has been confirmed as illustrated in FIG. 11 that the output values of laser oscillator 10 when the reflectance of reflection film 221 on the emission end surface was in a range of less than 0.35% and in a range larger than 2.2% were smaller than the output values of laser oscillator 10 when the reflectance of reflection film 221 on the emission end surface was in a range of equal to or larger than 0.35% and equal to or smaller than 2.2%. It can be said from the above results that the light output of laser oscillator 10, which is the basic performance of laser oscillator 10, decreases in the range of the reflectance of less than 0.35% and in the range of the reflectance larger than 2.2%.

With respect to the results in FIG. 11, the present inventors have analyzed a cause due to which the light output value decreases as the reflectance becomes smaller with a boundary of the reflectance of 0.35% (hereinafter this cause will be referred to as "Cause 1") and a cause due to which the light output decreases as the reflectance becomes larger with a boundary of the reflectance of 2.2% (hereinafter this cause will be referred to as "Cause 2").

<Cause 1>

Laser modules 900 were taken out from laser oscillators 10, respectively, and each semiconductor laser array 200 was caused to perform laser oscillation by internal resonance. It turned out that in semiconductor laser array 200 including reflection film 221 with the reflectance of 0.07%, 0.16%, and 0.25%, a plurality of emitters 234 among 40 emitters 234 did not emit light.

Further, each semiconductor laser array 200 was taken out from laser modules 900 described above, and emitters 234 of each semiconductor laser array 200 were observed from a side of n-side electrode 219.

As a result, regions corresponding to emitters 234 were observed as illustrated in FIG. 12. FIG. 12 illustrates five emitters 234 among which three emitters 234 did not emit light. Further, it has been confirmed that crystal defect 600 was generated in the vicinity of each emission end surface of three emitters 234 described above.

Note that, since n-side electrode 219 is not disposed in a region, which is immediately below each emitter 234, of the rear surface of substrate 212, it is possible to visualize the emission intensity of each emitter 234 and the presence or absence of crystal defect 600.

Based on the results in FIG. 12, the present inventors have reached the following conclusion. It is necessary to inject relatively large power into emitter 234 in order to cause semiconductor laser array 200 to perform laser oscillation by internal resonance in a case where the reflectance of the emission end surface of semiconductor laser array 200 is extremely small. By injecting the power, a relatively large thermal loading was applied to emitter 234 and crystal defect 600 was generated.

Hereinafter, details of the aforementioned conclusion will be described.

When laser oscillator 10 is produced, it is necessary to investigate the gain wavelength and various properties (for example, the output value of laser light 1, semiconductor properties, and the like) of laser module 900, which has been prepared, by pre-measurement. The gain wavelength measurement is a measurement required for executing the work of selecting laser module 900.

At the time of the pre-measurement, it is necessary to cause semiconductor laser array 200 to perform laser oscillation at least once by internal resonance.

In a case where internal resonance is caused in semiconductor laser array 200, every energy of power that is supplied until the injected power reaches threshold power is converted into thermal energy. When the thermal load inside emitter 234 becomes large, crystal defect 600 is likely to occur in portions, to which stresses are applied, of resonator structure 214 and emitter 234.

In a case where external resonance is generated in laser oscillator 10 in which semiconductor laser array 200 including emitter 234 with crystal defect 600 is mounted, crystal defect 600 spreads even to light-emitting layer 215 and eventually crystals, which form light-emitting layer 215, are broken.

<Regarding Power at which Crystal Defect Begins to Occur>

Given the foregoing conclusion, it appears sufficient to set the reflectance of reflection film 221 on the emission end surface such that the threshold power becomes minimum.

The reflectance of reflection film 221 on the emission end surface, which indicates minimum threshold power (minimum threshold power Ptm), varies depending on resonator length x and the shape of emitter 234. In a case where semiconductor laser array 200 with a resonator length of 2000 µm is caused to perform laser oscillation by internal resonance, the reflectance of reflection film 221, at which the threshold power becomes minimum, is 5.5%.

In the example, semiconductor laser array 200 with a resonator length of 2000 µm was actually produced. In semiconductor laser array 200 described above, the threshold power indicated the minimum value when the reflectance of reflection film 221 on the emission end surface was 5.5% as illustrated in FIG. 13.

However, when the reflectance of reflection film 221 is caused to be 5.5%, the light output value of laser oscillator 10 becomes small as illustrated in FIG. 11. For this reason, it can be said that reflection film 221 of semiconductor laser array 200 in the present embodiment is required to have reflectance of smaller than 5.5%.

As illustrated in FIG. 13, there was a tendency that in a range of the reflectance of equal to or smaller than 0.35% and equal to or larger than 0.16%, the threshold power ratio became larger as the reflectance became smaller. Accordingly, the reflectance of 0.35% at which the light output value of laser oscillator 10 begins to decrease is preferably the lower limit of the reflectance. The threshold power at that time can be said to correspond to a maximum value of a power range where crystal defect 600 does not occur in emitter 234. According to FIG. 13, the threshold power when the reflectance was 0.35% was 1.4 times the threshold power (minimum threshold power Ptm) when the reflectance was 5.5%.

As described above, the following conclusion was obtained based on FIGS. 11 to 13. When power exceeding power 1.4 times minimum threshold power Ptm is supplied to semiconductor laser array 200, crystal defect 600 is generated in emitter 234. Since crystal defect 600 described above has broken light-emitting layer 215, the light output of laser oscillator 10 decreases.

Further, it is satisfactory to determine the lower limit of reflectance R as 0.35% when the resonator length is 2000 μm. More generally speaking, it is satisfactory to determine the lower limit of reflectance R as the reflectance of reflection film 221 when semiconductor laser array 200 performs laser oscillation with power 1.4 times minimum threshold power Ptm.

<Cause 2>

First, the wavelength spectra of laser light 3 were investigated for laser oscillator 10 in which laser modules 900, in which semiconductor laser array 200 including reflection film 221 with reflectance of 3.3% was mounted, were disposed. Here, one of five laser modules 900 of laser oscillator 10 was caused to perform laser oscillation by external resonance, and the wavelength spectra of laser light 3 obtained from laser oscillator 10 were analyzed by a spectrometer (see FIG. 14B).

Further, for comparison, the wavelength spectra of laser light 3 were investigated in the same manner for laser oscillator 10 in which laser modules 900 in which semiconductor laser array 200 including reflection film 221 with reflectance of 0.16% was mounted were disposed (see FIG. 14A).

The wavelength spectra in FIGS. 14A and 14B were generated by changing each lock wavelength in a range of ±3.0 nm from the gain wavelength of each laser module 900, causing laser light 3 to be outputted at each lock wavelength, obtaining the wavelength spectra of laser light 3 described above, and arranging the acquired wavelength spectra. Note that, each lock wavelength was adjusted by changing the relative orientation of each laser module 900 with respect to diffraction grating 208.

As illustrated in FIG. 14A, it has been found that in the wavelength spectra with the reflectance of 0.16%, there was no spectral peak 701 of light (described later) obtained by internal resonance but there was only spectral peak 700 of light obtained by external resonance, and further spectral peak 700 transitioned to a side of higher wavelength or a side of lower wavelength in accordance with changes in the lock wavelength. Hereinafter, such a feature will be referred to as "ideal spectral feature". Further, it has been found based on the spectra in FIG. 14A that external resonance occurred even when the lock wavelength changed by ±3.0 nm.

Wavelength spectra obtained from laser oscillator 10 used in the WBC type processing apparatus preferably have the ideal spectral feature described above.

However, it has been found that in the wavelength spectra with the reflectance of 3.3%, there was spectral peak 701 of light obtained by internal resonance even when the lock wavelength was shifted by ±1.5 nm from 438 nm as illustrated in FIG. 14B.

Thus, it is reasonable to consider the reasons that spectral peak 701 due to internal resonance and spectral peak 700 due to external resonance are mixedly present as follows. As illustrated in FIG. 4A, the reflectance of reflection film 221 became larger than 2.2% when the wavelength was shifted from 438 nm to the side of lower wavelength by a predetermined value (a value larger than 1.5 nm). Then, internal resonance occurs in semiconductor laser array 200 at the shifted wavelength.

In a case where the effect of internal resonance is relatively large, the internal resonance may become a factor that the laser output value decreases due to external resonance.

Accordingly, in a case where laser oscillator 10 is produced by using semiconductor laser array 200 in which the reflectance of reflection film 221 is set to a value larger than a specific value, it can be considered that one or some of emitters 234 of semiconductor laser array 200 described above perform(s) oscillation by internal resonance when following factors 1 to 3 are satisfied. Further, since laser light 1 oscillated from the above laser oscillation is not oscillated due to external resonance and therefore does not contribute to the light output of laser oscillator 10. Laser light 1 described above can be rather considered to decrease the light output of laser oscillator 10.

(Factor 1) Variance in the gain wavelength for each emitter 234 of semiconductor laser array 200 is larger than a constant value;

(Factor 2) Variance in the reflectance of reflection film 221 is larger than a constant value; and (Factor 3) Deviation between the gain wavelength and the lock wavelength is larger than a constant value.

The specific value described above is a value larger than approximately 2.2%, that is, a value larger than 2.225%, which is the product of the reflectance of external resonance mirror 210 of 15% and the coupling efficiency of 15%.

For example, for laser oscillator 10 including semiconductor laser array 200 in which the reflectance of reflection film 221 is set to 5.5% in the present example, it can be estimated that when laser light 3 is outputted by external resonance, approximately 6% of emitters 234 perform laser oscillation by internal resonance when estimation is performed based on the amount of the decrease in the light output (see FIG. 11).

In view of the matters described above, the present inventors have concluded that in one or some of emitters 234 in laser oscillator 10, the feedback ratio of internal resonance becomes larger than the feedback ratio of outer resonance and the light output decreased in the present example. Further, the present inventors have concluded that the reflectance that coincides with the product of the reflectance of external resonance mirror 210 and coupling efficiency C is a critical point at which the light output value of laser oscillator 10 begins to decrease, and that it is satisfactory to determine the critical point as the upper limit. This leads to the conclusion that, by reflectance R of reflection film 221 on the emission end surface satisfying relational expression 1, pre-measurement can be performed without generating crystal defect 600 in semiconductor laser array 200 and the effect of internal resonance can be suppressed to a minimum when laser light 3 is oscillated by external resonance so that a decrease in the laser power value can be suppressed.

Although the present example was carried out based on the embodiment of semiconductor laser array 200, a similar conclusion is derived even in a case where semiconductor laser element 100 is used.

As described above, semiconductor laser element 100 according to the embodiment is disposed in laser oscillator 10 included in a WBC processing apparatus including external resonance mirror 210, and includes: resonator structure 214 including light-emitting layer 215 that emits laser light 1; and reflection film 222 and reflection film 221 that are provided on a non-emission end surface of resonator structure 214 and an emission end surface of resonator structure 214, respectively, and reflect laser light 1. Further, reflectance R of reflection film 221 at a gain wavelength of semiconductor laser element 100 satisfies relational expression 1 described above where R1 is reflectance of reflection film 221 when resonator structure 214 performs laser oscillation with power P14 1.4 times a minimum value (minimum threshold power Ptm) of threshold power which is minimum power for resonator structure 214 to perform the laser oscillation, R(Oc) is reflectance of external resonance mirror 210, and C is coupling efficiency which is a ratio of light, which is reflected by external resonance mirror 210 and is incident in resonator structure 214, to light which is reflected by external resonance mirror 210.

Laser oscillator 10 included in the processing apparatus according to the embodiment includes laser module 900 including semiconductor laser element 100 that is a single semiconductor laser element.

As described in the example, according to the embodiment, when laser oscillator 10 is produced by using semiconductor laser element 100, no crystal defect occurs in semiconductor laser element 100 even when laser oscillation is caused by internal resonance in pre-measurement. Accordingly, the output value of laser oscillator 10 does not decrease. Further, when laser light 3 is oscillated by external resonance in laser oscillator 10, the effect of internal resonance is small with respect to the light output of the external resonance so that a decrease in the laser output value of laser oscillator 10 due to the internal resonance is suppressed. Accordingly, laser light 3 suitable for laser oscillator 10 used in the processing apparatus is obtained.

Accordingly, high output of laser oscillator 10 and further high output of the processing apparatus can be achieved.

Further, since it is not necessary to incorporate semiconductor laser element 100 with a crystal defect into laser oscillator 10, the output value of laser oscillator 10, that is, the processing apparatus can be stabilized.

In semiconductor laser element 100 according to the present embodiment, no crystal defect occurs in each emitter 234 even when pre-measurement is executed so that specific measurement and analysis for investigating the presence of crystal defects are not required. Accordingly, it is possible to easily produce laser oscillator 10 with stable laser output values.

Semiconductor laser array 200 according to the embodiment includes a plurality of semiconductor laser elements 100 described above. Further, laser oscillator 10 included in the processing apparatus according to the embodiment includes laser module 900 including semiconductor laser array 200. Accordingly, the same effect as in a case where laser oscillator 10 is produced by using semiconductor laser element 100 is obtained.

Further, it is difficult to discover crystal defects present in each emitter 234 of semiconductor laser array 200 by measurement and/or analysis between the end of pre-measurement and the incorporation of semiconductor laser array 200 into laser oscillator 10. As a matter of course, it can be said that it is also difficult to select and remove only emitter(s) 234, in which a crystal defect(s) occur(s), from semiconductor laser array 200 prior to the incorporation into laser oscillator 10.

As described above, in semiconductor laser array 200 according to the present embodiment, no crystal defect occurs in each emitter 234 even when pre-measurement is executed so that specific measurement and analysis for investigating the presence of crystal defects are not required. Accordingly, it is possible to easily produce laser oscillator 10 with stable laser output values.

Semiconductor laser array 200 according to the embodiment is a component formed of a plurality of semiconductor laser elements 100 as a set. That is, semiconductor laser array 200 is a component including a plurality of laser light sources. Accordingly, it is possible to reduce the number of laser modules 900 to be incorporated into laser oscillator 10 in comparison with a case where laser module 900 is produced for each semiconductor laser element 100 and laser modules 900 thus obtained are incorporated into laser oscillator 10.

[Variation 1]

Hereinafter, Variation 1 will be described mainly with respect to points that are different from those in the embodiment.

Reflection film 221 of semiconductor laser element 100 and semiconductor laser array 200 according to Variation 1 has small variance in reflectance in comparison with reflection film 221 in the embodiment. That is, reflection film 221 according to Variation 1 has constant reflectance regardless of the position. Further, deviation between the gain wavelength and the lock wavelength in laser oscillator 10 used in a processing apparatus according to Variation 1 is smaller than the deviation between the gain wavelength and the lock wavelength in laser oscillator 10 used in the processing apparatus according to the embodiment.

In Variation 1, the thickness of each layer (dielectric layer) forming reflection film 221 is precisely controlled in order to reduce variance in the reflectance of reflection film 221. Further, in order to reduce the deviation between the gain wavelength and the lock wavelength, laser module 900 including semiconductor laser element 100 or semiconductor laser array 200 with a smaller deviation between the gain wavelength and the lock wavelength is selected when laser module 900 to be incorporated into laser oscillator 10 is selected.

Reflectance R of reflection film 221 on the emission end surface at gain wavelengths of semiconductor laser element 100 and semiconductor laser array 200 according to Variation 1 satisfies relational expression 2.

$$R1 \leq R \leq 2 \times R(Oc) \times C \quad \text{(Relational Expression 2)}$$

That is, the upper limit of reflectance R in Variation 1 is twice the upper limit of reflectance R in the embodiment.

Hereinafter, the grounds for relational expression 2 will be described.

<Another Upper Limit (1) in Example>

The present inventors have further conducted an earnest investigation into the upper limit of the reflectance of reflection film 221 on the emission end surface based on the results of the example. Hereinafter, details thereof will be described.

Laser oscillator 10 was produced such that variance in the reflectance of reflection film 221 on the emission end surface of semiconductor laser array 200 and the deviation between the gain wavelength and the lock wavelength became small. Specifically, the variance in the reflectance of reflection film 221 on the emission end surface was reduced by precisely controlling the thickness of each layer (dielectric layer) forming reflection film 221. Further, the deviation between the gain wavelength and the lock wavelength was reduced by selecting semiconductor laser array 200 with the gain wavelength closer to the lock wavelength.

As a result, it has been confirmed that the light output value of laser oscillator 10 does not decrease even in a case where the value of the reflectance of reflection film 221 on the emission end surface is set as a value coinciding with a value twice 2.225% (1.5%×1.5%) which is the product of the reflectance of external resonance mirror 210 of laser oscillator 10 and the coupling efficiency.

That is, it has been confirmed that when the variance in the reflectance of reflection film 221 on the emission end surface of semiconductor laser array 200 and the deviation between the gain wavelength and the lock wavelength can be reduced, the light output value of laser oscillator 10 does not decrease even when the reflectance of reflection film 221 is caused to be relatively large.

The results of the earnest investigation into another upper limit (1) described above are the same even in a case where semiconductor laser element 100 is used.

As described above, according to Variation 1, since reflectance R of reflection film 221 on the emission end surface satisfies relational expression 2 even when the reflectance of reflection film 221 on the emission end surface is set to a relatively large value, the effect of internal resonance can be suppressed to be small, and the output value of laser oscillator 10, that is, the output value of the processing apparatus does not decrease.

[Variation 2]

Hereinafter, Variation 2 will be described mainly with respect to points that are different from those in Variation 1.

Reflection film 221 on the emission end surface of semiconductor laser element 100 and semiconductor laser array 200 according to Variation 2 has small variance in reflectance in comparison with reflection film 221 of Variation 1. Further, deviation between the gain wavelength and the lock wavelength in laser oscillator 10 used in a processing apparatus according to Variation 2 is smaller than the deviation between the gain wavelength and the lock wavelength in laser oscillator 10 used in the processing apparatus according to Variation 1.

In Variation 2, the thickness of each layer (dielectric layer) forming reflection film 221 on the emission end surface is more strictly controlled. Further, when laser module 900 to be incorporated into laser oscillator 10 is selected, laser module 900 including semiconductor laser element 100 or semiconductor laser array 200 with the gain wavelength coinciding with or much closer to the lock wavelength is selected.

Further, in a case where resonator structure 214 is produced, growth temperature distribution of light-emitting layer 215 is suppressed. Thus, variance in gain wavelengths of a plurality of emitters 234 to be finally completed becomes smaller. Further, the gain wavelengths of the plurality of emitters 234 become the same as or relatively close to the lock wavelength of laser oscillator 10.

Reflectance R of reflection film 221 on the emission end surface at gain wavelengths of semiconductor laser element 100 and semiconductor laser array 200 according to Variation 2 satisfies relational expression 3.

$$R1 \leq R \leq 3 \times R(Oc) \times C \quad \text{(Relational Expression 3)}$$

That is, the upper limit of reflectance R of the emission end surface in Variation 2 is three times the upper limit of reflectance R in the embodiment.

Hereinafter, the grounds for relational expression 3 will be described.

<Another Upper Limit (2) in Example>

The present inventors have further conducted an earnest investigation into the upper limit of the reflectance of reflection film 221 on the emission end surface based on the results of the example and the results of the other upper limit (1) described above. Hereinafter, details thereof will be described.

Laser oscillator 10 was produced such that variance in the reflectance of reflection film 221 of semiconductor laser array 200 and deviation between the gain wavelength and the lock wavelength became much smaller.

Specifically, the variance in the reflectance of reflection film 221 on the emission end surface was reduced by more strictly controlling the thickness of each layer (dielectric layer) forming reflection film 221 on the emission end surface. Further, the deviation between the gain wavelength and the lock wavelength was further reduced by selecting semiconductor laser array 200 with the gain wavelength coinciding with or much closer to the lock wavelength of laser oscillator 10.

Further, variance in gain wavelengths of a plurality of emitters 234 to be finally completed was reduced by suppressing growth temperature distribution of light-emitting layer 215 at the time of producing semiconductor laser array 200. Thus, the gain wavelengths of the plurality of emitters 234 became the same as or relatively close to the lock wavelength of laser oscillator 10.

As a result, it has been confirmed that the light output value of laser oscillator 10 does not decrease even in a case where the value of the reflectance of reflection film 221 on the emission end surface is set as a value coinciding with a value three times 2.225% (1.5%×1.5%) which is the product of the reflectance of external resonance mirror 210 of laser oscillator 10 and the coupling efficiency.

That is, it has been confirmed that when the variance in the reflectance of reflection film 221 on the emission end surface of semiconductor laser array 200 and the deviation between the gain wavelength and the lock wavelength can be further reduced, the light output value of laser oscillator 10 does not decrease even when the reflectance of reflection film 221 is caused to be relatively large.

The results of the earnest investigation into another upper limit (2) described above are the same even in a case where semiconductor laser element 100 is used.

As described above, according to Variation 2, since reflectance R of reflection film 221 on the emission end surface satisfies relational expression 3 even when the reflectance of reflection film 221 on the emission end surface is set to a much larger value, the effect of internal resonance can be suppressed to be small, and the output value of laser oscillator 10, that is, the output value of the processing apparatus does not decrease.

[Variation 3]

Hereinafter, Variation 3 will be described mainly with respect to points that are different from those in the embodiment.

The gain wavelength of light-emitting layer 215 of semiconductor laser element 100 and semiconductor laser array 200 according to Variation 3 is in a range of equal to or larger than 350 nm and equal to or smaller than 450 nm, and the resonator length according to Variation 3 is in a range of equal to or larger than 1200 μm and equal to or smaller than 3000 μm.

Further, when the resonator length is x, reflectance R of reflection film 221 on the emission end surface at a gain wavelength of semiconductor laser element 100 or semiconductor laser array 200 satisfies relational expression 4.

$$R \leq 0.3568 e^{-0.001x} \qquad \text{(Relational Expression 4)}$$

In addition, reflectance R further satisfies relational expression 5.

$$0.8613 e^{-0.003x} \leq R \qquad \text{(Relational Expression 5)}$$

The range of reflectance R satisfying relational expressions 4 and 5 is a numerical range that can be realized in terms of producing reflection film 221. Accordingly, according to Variation 3, when the configurations (in particular, the resonator length) of semiconductor laser element 100 or semiconductor laser array 200 and laser oscillator 10 that are produced in advance are determined, the same effect as in the embodiment can be obtained by setting reflectance R of reflection film 221 so as to satisfy relational expressions 4 and 5 in accordance with the resonator length. Note that, as long as the resonator length is set to equal to or larger than 1200 μm and equal to or smaller than 3000 μm, the upper limit value calculated based on relational expression 4 does not become smaller than the lower limit value calculated based on relational expression 5.

In a case where semiconductor laser element 100 and semiconductor laser array 200 are each formed of a nitride semiconductor and include light-emitting layer 215 with the gain wavelength of equal to or larger than 350 nm and equal to or smaller than 480 nm as in Variation 3, a high light output value is obtained in a range of the resonator length of equal to or larger than 1200 μm and equal to or smaller than 3000 μm. Further, in light-emitting layer 215 formed of a nitride semiconductor, a crystal defect is likely to occur at the time of pre-measurement in comparison with light-emitting layers formed of other materials such as GaAs and InP.

That is, according to Variation 3, even when semiconductor laser element 100 and semiconductor laser array 200 are each formed of a material due to which a crystal defect is relatively likely to occur, the same effect as in the embodiment can be surely obtained by setting the reflectance of reflection film 221 such that relational expressions 4 and 5 are satisfied.

Hereinafter, the reason that the effect described above is obtained by Variation 3 will be described.

Based on the results of the example, the present inventors have conducted an earnest investigation into ideal upper and lower limits of the reflectance of reflection film 221 on the emission end surface with respect to semiconductor laser array 200 having the same configuration as that of semiconductor laser array 200 in the example except for the resonator length.

First, the present inventors have estimated the upper and lower limits of the reflectance of reflection film 221 on the emission end surface when the resonator length is 1200 μm, 1500 μm, and 3000 μm.

Here, as the lower limit, the present inventors have estimated, based on following (a) to (c), minimum reflectance at which crystal defect 600 does not occur in semiconductor laser array 200 and the light output value of laser oscillator 10 does not decrease even when laser oscillation is caused by internal resonance.

(a) The tendency that the threshold power increases as the reflectance of reflection film 221 is reduced in a range where the reflectance of reflection film 221 on the emission end surface is relatively low (see FIG. 13);
(b) The lower limit when the resonator length is 2000 μm (the result of the example); and
(c) The relationship between the resonator length and the threshold power.

Further, as the upper limit, the present inventors have estimated, based on following (d) and (e), a maximum value of reflectance at which no internal resonance occurs in emitter 234 of semiconductor laser array 200 and the light output value of laser oscillator 10 does not decrease when laser light 3 is outputted from laser oscillator 10 by external resonance.

(d) The tendency that the longer the resonator length, the smaller the optimal reflectance of external resonance mirror 210; and
(e) The optimal reflectance (5.6%) of external resonance mirror 210 when the resonator length is 2000 μm.

Figure 15:
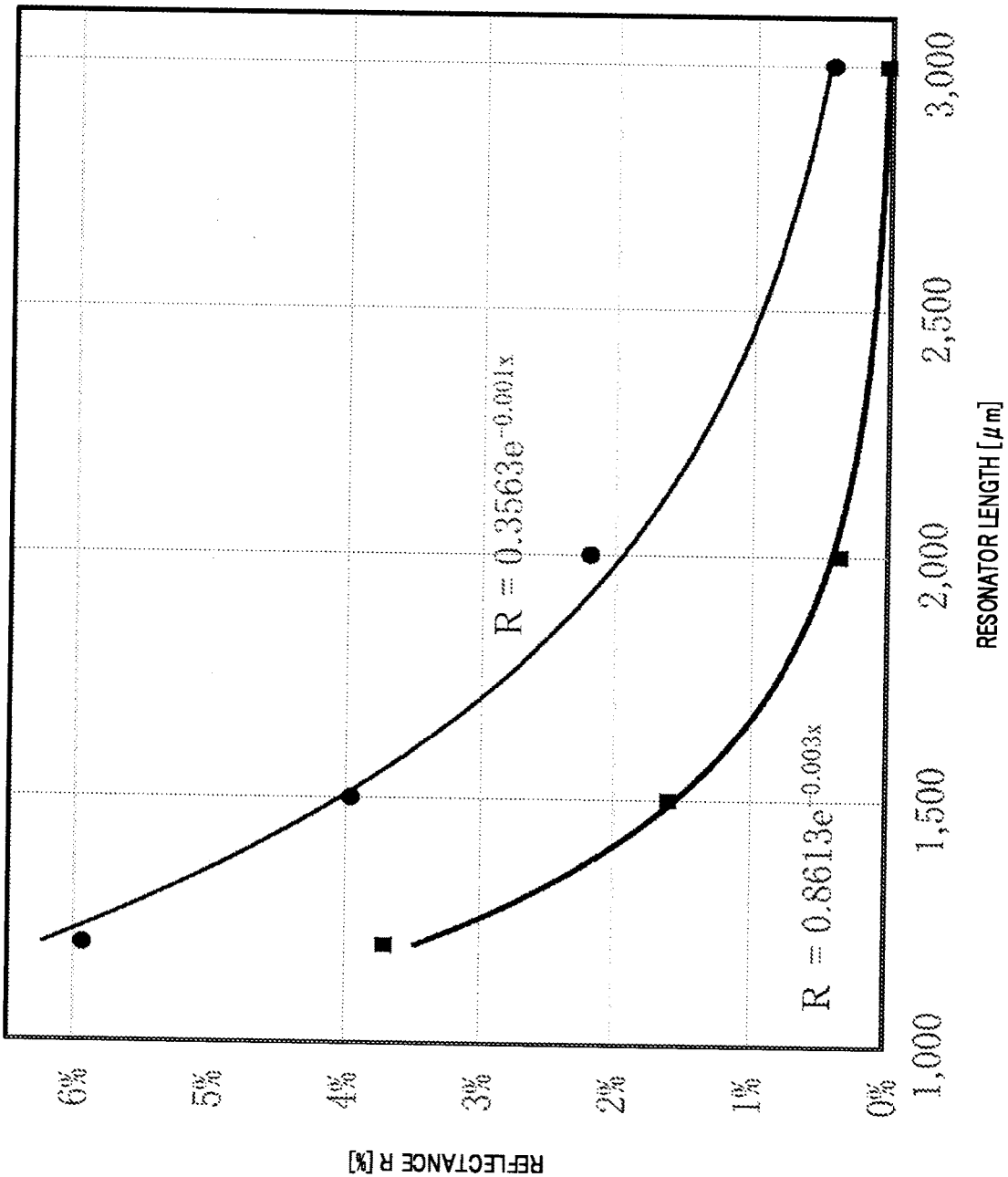
FIG. 15 illustrates a relationship between each of upper and lower limits of the reflectance of the reflection film on the emission end surface and a resonator length.

FIG. 15 illustrates a relationship between each of the upper and lower limits of the reflectance of reflection film 221 on the emission end surface and the resonator length. In FIG. 15, in addition to the upper and lower limits determined by the example (both were obtained experimentally), upper and lower limits (both are estimated values) are plotted when the resonator length is 1200 μm, 1500 μm, and 3000 μm.

When a plurality of upper limit data and a plurality of lower limit data in FIG. 15 are fitted, respectively, it has been found that the upper limit function is given by $0.3568 e^{-0.001x}$ and the lower limit function is given by $0.8613 e^{-0.003x}$, where the resonator length is x.

That is, it has been found that in a case where semiconductor laser array 200 satisfies at least following conditions 1 and 2, laser light 3 with higher power can be outputted from laser oscillator 10 by setting the value of the reflectance of reflection film 221 such that relational expressions 4 and 5 described above are satisfied, where the reflectance of reflection film 221 is R.

(Condition 1) Semiconductor laser array 200 includes light-emitting layer 215 for which the gain wavelength is in a range of equal to or larger than 350 nm and equal to or smaller than 450 nm; and
(Condition 2) Semiconductor laser array 200 includes emitter 234 for which the resonator length is in a range of equal to or larger than 1200 μm and equal to or smaller than 3000 μm.

When reflectance R of reflection film 221 on the emission end surface satisfies relational expressions 4 and 5 described above, it can be said that even when laser oscillation is caused by internal resonance in pre-measurement, crystal defect 600 hardly occurs in semiconductor laser array 200 and a decrease in the laser output value of laser oscillator 10 due to crystal defect 600 can be prevented. Further, it can be said that when laser oscillator 10 is laser-oscillated by external resonance, a decrease in the output value of laser light 3 due to internal resonance can be prevented.

Further, since crystal defect 600 hardly occurs in semiconductor laser array 200, it is not necessary to use semiconductor laser array 200 with crystal defect 600 in the production of laser oscillator 10 so that it can be said that the laser output value from laser oscillator 10 becomes stable.

Note that, the results of the earnest investigation into the upper and lower limits of the reflectance of reflection film 221 on the emission end surface described above are the same even in a case where semiconductor laser element 100 is used.

[Other Variations]

Although semiconductor laser array 200 according to the present embodiment and Variations 1 and 2 has been described as a GaN-based semiconductor laser array in which a GaN-based compound is used as a material and which emits laser light 1 in a wavelength band of equal to or larger than 405 nm and equal to or smaller than 450 nm, the material and the wavelength band are not limited thereto. Even in a case where a GaN-based semiconductor laser array is employed as semiconductor laser array 200 according to the present embodiment and Variations 1 and 2, it may be, for example, a semiconductor laser array that emits laser light 1 in a wavelength band of equal to or larger than 350 nm and equal to or smaller than 405 nm (from blue-violet to ultraviolet).

Further, semiconductor laser array 200 according to the present embodiment and Variations 1 to 3 may be a semiconductor laser array made of, as a material, another III-V group semiconductor material such as GaAs or InP.

The contents described in the other variations above apply not only to semiconductor laser array 200, but also to semiconductor laser element 100 according to the present embodiment and Variations 1 to 3.

INDUSTRIAL APPLICABILITY

The semiconductor laser element, semiconductor laser array and processing apparatus according to the present disclosure are suitable for a wavelength beam combining type processing apparatus.

REFERENCE SIGNS LIST

1 Laser light
2 External resonance light
3 Laser light
4 Light
10 Laser oscillator
11 Housing
17 Mirror
100 Semiconductor laser element
199 Array body
200 to 205 Semiconductor laser array
206 Beam twister unit
208 Diffraction grating
210 External resonance mirror
212 Substrate
214 Resonator structure
215 Light-emitting layer
216 First semiconductor layer
217 Second semiconductor layer
219 n-Side electrode
221 Reflection film
222 Reflection film
233 Projection
234 Emitter
283 p-Side electrode
400 Multilayer
600 Crystal defect
700 Spectral peak
701 Spectral peak
900 to 905 Laser module
920 Submount
930 Upper-side metal block
940 Lower-side metal block
950 Insulation sheet
960 Heat conductive sheet
970 Water-cooled pedestal
x Resonator length
L Distance
α Incident angle
β Output angle

The invention claimed is:

1. A semiconductor laser element disposed in a wavelength beam combining type processing apparatus including an external resonance mirror, the semiconductor laser element comprising:
a resonator structure including a light-emitting layer that emits laser light; and
a first reflection film and a second reflection film that are provided on a non-emission end surface of the resonator structure and an emission end surface of the resonator structure, respectively, and reflect the laser light, wherein
reflectance R of the second reflection film at a gain wavelength of the semiconductor laser element satisfies the following relational expression:

$$R1 \leq R \leq R(Oc) \times C$$

where R1 is reflectance of the second reflection film when the resonator structure performs laser oscillation with power 1.4 times a minimum value of threshold power, R(Oc) is reflectance of the external resonance mirror, and C is coupling efficiency, the threshold power being minimum power for the resonator structure to perform the laser oscillation, the coupling efficiency being a ratio of light, which is reflected by the external resonance mirror and is incident in the resonator structure, to light which is reflected by the external resonance mirror.

2. The semiconductor laser element according to claim 1, wherein:
a resonator length is equal to or larger than 1200 μm and equal to or smaller than 3000 μm the resonator length being a length of the resonator structure, and
the reflectance R of the second reflection film at the gain wavelength of the semiconductor laser element satisfies the following relational expression:

$$R \leq 0.3568 e^{-0.001x}$$

where the resonator length is x.

3. The semiconductor laser element according to claim 2, wherein the reflectance R further satisfies the following relational expression:

$$0.8613 e^{-0.003x} \leq R.$$

4. A semiconductor laser element disposed in a wavelength beam combining type processing apparatus including an external resonance mirror, the semiconductor laser element comprising:
a resonator structure including a light-emitting layer that emits laser light; and
a first reflection film and a second reflection film that are provided on a non-emission end surface of the resonator structure and an emission end surface of the resonator structure, respectively, and reflect the laser light, wherein reflectance R of the second reflection film at a gain wavelength of the semiconductor laser element satisfies the following relational expression:

$$R1 \leq R \leq 2 \times R(Oc) \times C$$

where R1 is reflectance of the second reflection film when the resonator structure performs laser oscillation with power 1.4 times a minimum value of threshold power, R(Oc) is reflectance of the external resonance mirror, and C is coupling efficiency, the threshold power being minimum power for the resonator structure to perform the laser oscillation, the coupling efficiency being a ratio of light, which is reflected by the external resonance mirror and is incident in the resonator structure, to light which is reflected by the external resonance mirror.

5. A semiconductor laser element disposed in a wavelength beam combining type processing apparatus including an external resonance mirror, the semiconductor laser element comprising:
   a resonator structure including a light-emitting layer that emits laser light; and
   a first reflection film and a second reflection film that are provided on a non-emission end surface of the resonator structure and an emission end surface of the resonator structure, respectively, and reflect the laser light, wherein reflectance R of the second reflection film at a gain wavelength of the semiconductor laser element satisfies the following relational expression:

$$R1 \leq R \leq 3 \times R(Oc) \times C$$

where R1 is reflectance of the second reflection film when the resonator structure performs laser oscillation with power 1.4 times a minimum value of threshold power, R(Oc) is reflectance of the external resonance mirror, and C is coupling efficiency, the threshold power being minimum power for the resonator structure to perform the laser oscillation, the coupling efficiency being a ratio of light, which is reflected by the external resonance mirror and is incident in the resonator structure, to light which is reflected by the external resonance mirror.

6. A wavelength beam combining type processing apparatus, comprising the semiconductor laser element according to claim 1.

7. A semiconductor laser array, comprising a plurality of the semiconductor laser elements according to claim 1.

8. A wavelength beam combining type processing apparatus, comprising the semiconductor laser array according to claim 7.

* * * * *